(12) United States Patent
Kawasumi

(10) Patent No.: US 8,379,436 B2
(45) Date of Patent: Feb. 19, 2013

(54) SEMICONDUCTOR MEMORY DEVICE

(75) Inventor: Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/243,738

(22) Filed: Sep. 23, 2011

(65) Prior Publication Data

US 2012/0195135 A1 Aug. 2, 2012

(30) Foreign Application Priority Data

Jan. 28, 2011 (JP) ................. 2011-016245

(51) Int. Cl.
*G11C 11/00* (2006.01)

(52) U.S. Cl. .............. 365/156; 365/189.06; 365/226

(58) Field of Classification Search .......... 365/154, 365/156, 189.07, 189.06, 190, 226, 227
See application file for complete search history.

(56) References Cited

U.S. PATENT DOCUMENTS

| | | | |
|---|---|---|---|
| 3,969,707 A * | 7/1976 | Lane et al. | 365/49.11 |
| 5,659,512 A | 8/1997 | Koyanagi et al. | |
| 6,366,492 B1 | 4/2002 | Kawasumi | |
| 6,466,486 B2 | 10/2002 | Kawasumi | |
| 6,563,362 B2 * | 5/2003 | Lambert | 327/333 |
| 6,674,660 B2 * | 1/2004 | Shau | 365/49.1 |
| 7,064,971 B2 * | 6/2006 | Shau | 365/49.15 |
| 7,290,154 B2 * | 10/2007 | Palem et al. | 713/320 |

FOREIGN PATENT DOCUMENTS

JP   H076585   1/1995

* cited by examiner

*Primary Examiner* — Gene Auduong
(74) *Attorney, Agent, or Firm* — Knobbe, Martens, Olson & Bear LLP

(57) ABSTRACT

According to one embodiment, a semiconductor memory device includes a plurality of memory cells each of which is arranged at the intersection position between a pair of complementary bit lines and a word line, and stores data between a first power supply voltage applied to a first node and a voltage applied to a virtual ground node, and a control circuit which changes the amount of current of the pair of bit lines in accordance with the amplitude of the pair of bit lines for each column in a memory macro, that is formed by arranging the plurality of memory cells in a matrix, in the data read operation of each of the plurality of memory cells.

15 Claims, 18 Drawing Sheets

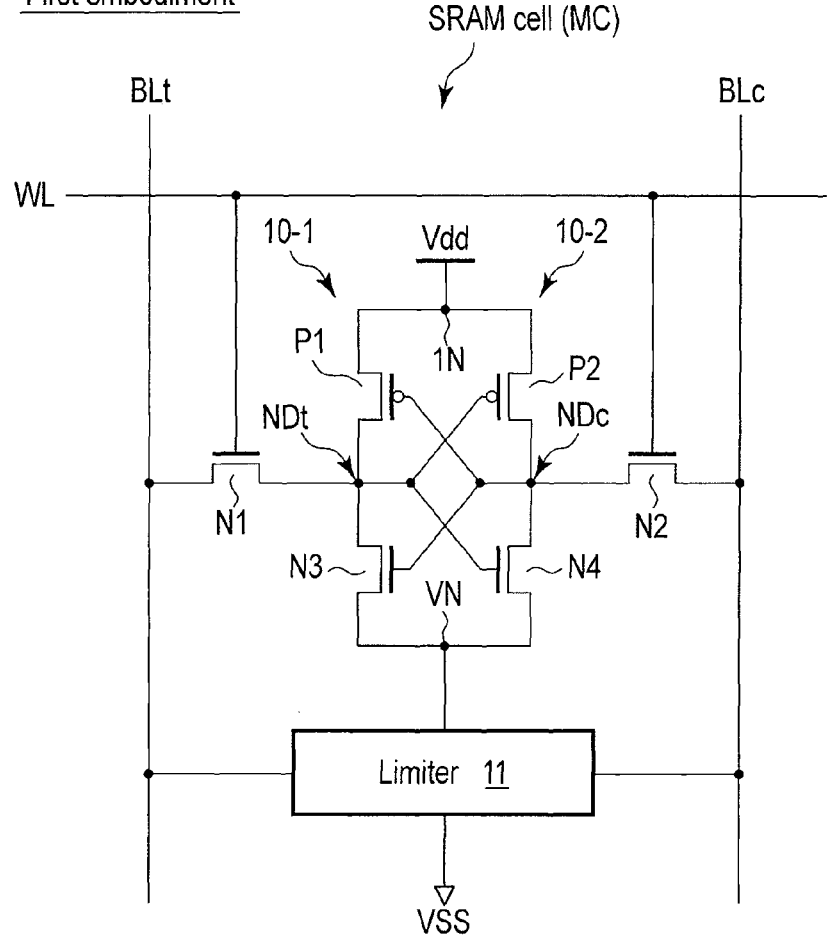
F I G. 2
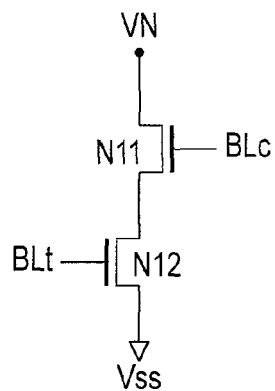
F I G. 3

Selected memory cell in data read/data write (first embodiment)

Limiter 11 (second embodiment)
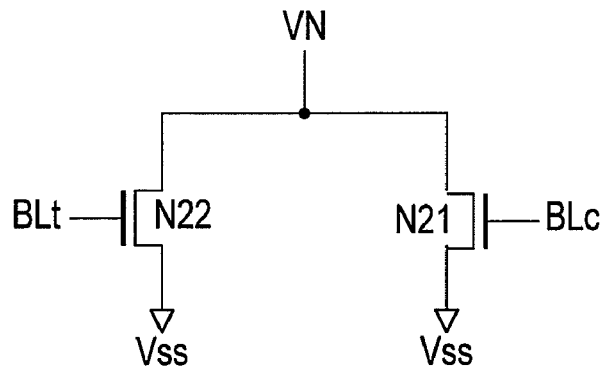
F I G. 6
Limiter 11 (third embodiment)
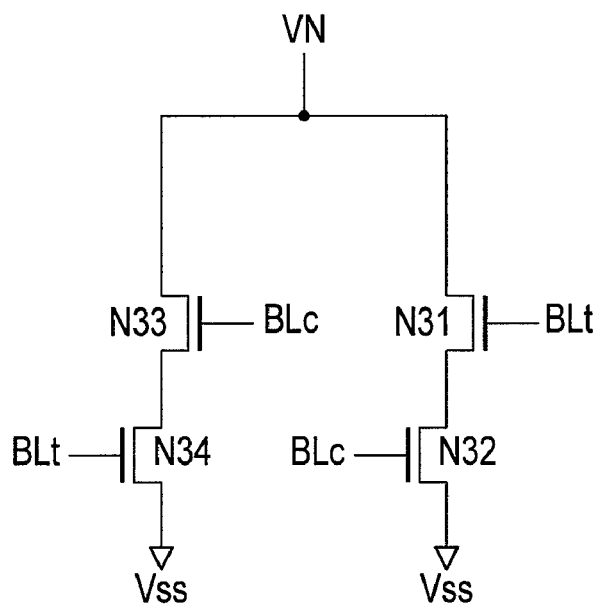
F I G. 7

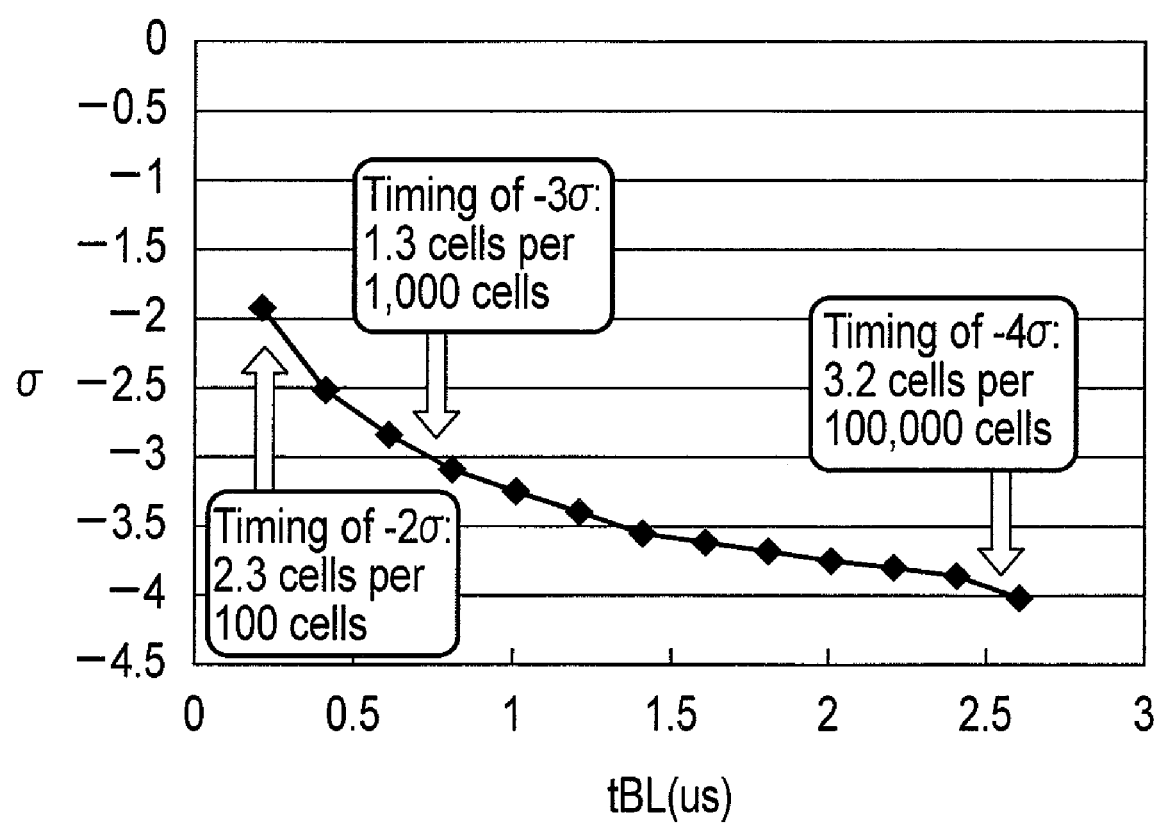
F I G. 1 1

SRAM cell (MC)

Power supply booster 15 (sixth embodiment)

Monte Carlo simulation

Power supply booster 15 (seventh embodiment)

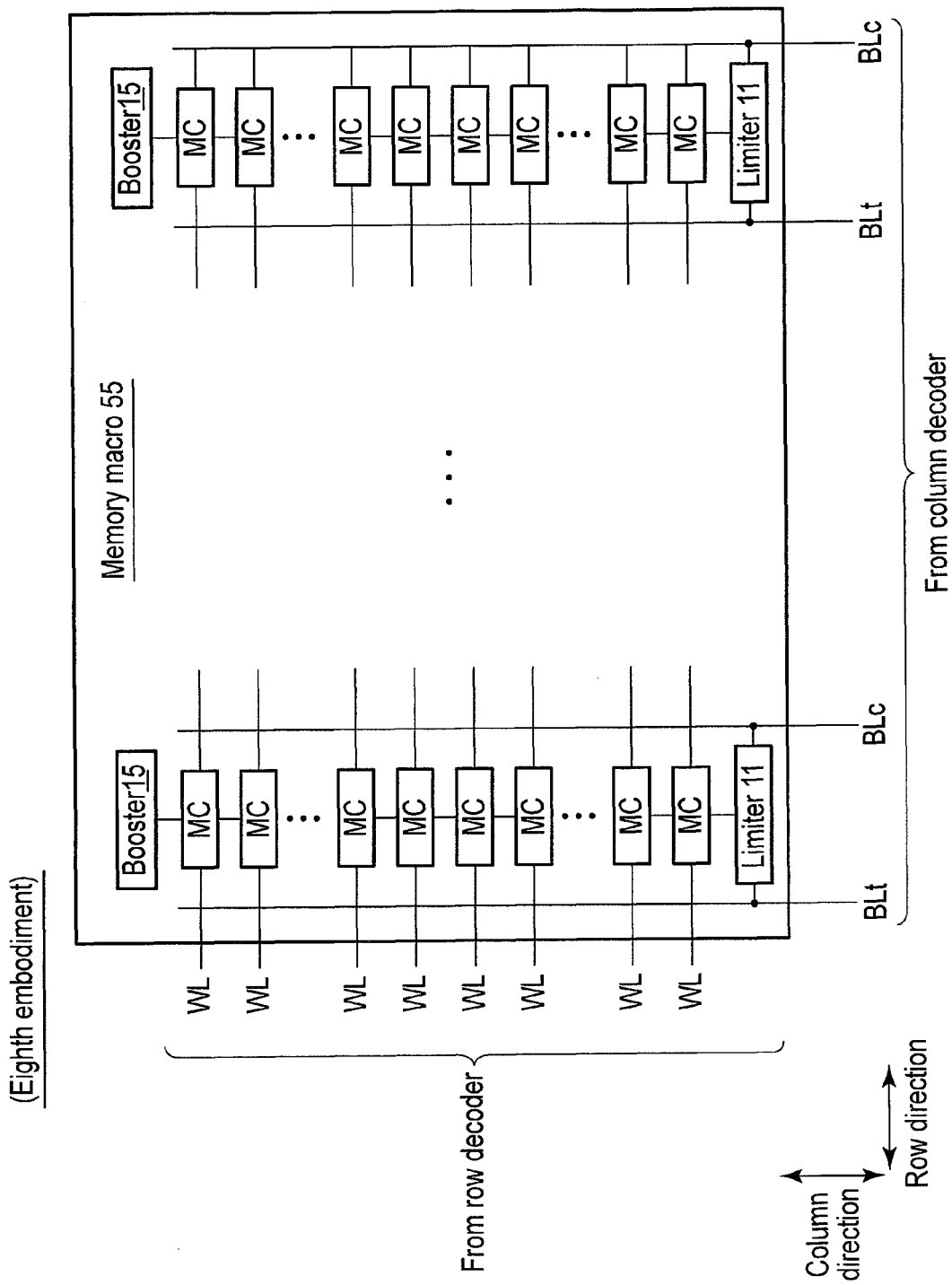
F I G. 17

Example of arrangement of limiter 11

Column having insufficient amplitude (slow column)

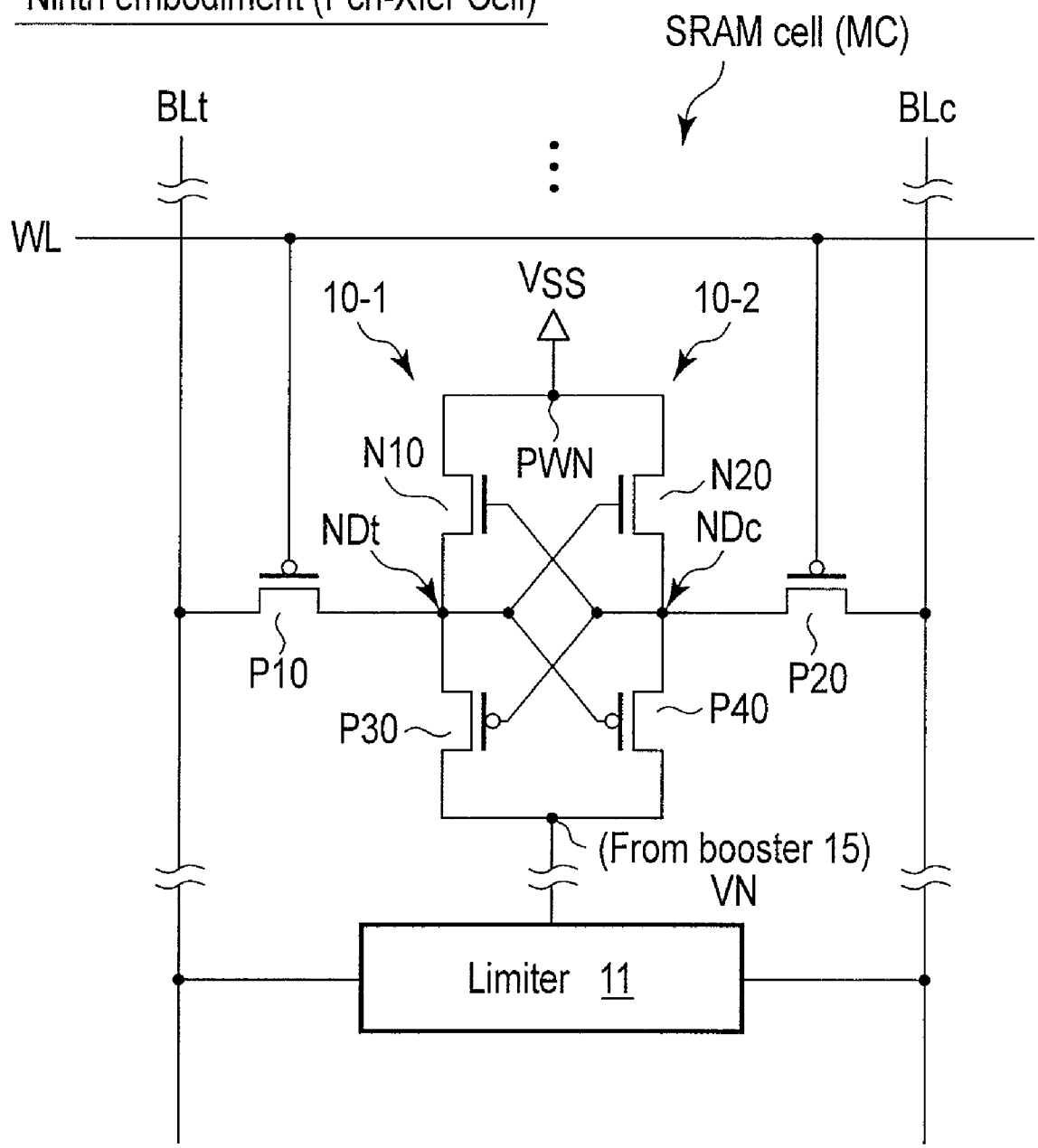
F I G. 22

Example of arrangement of limiter 11

SEMICONDUCTOR MEMORY DEVICE

CROSS-REFERENCE TO RELATED APPLICATIONS

This application is based upon and claims the benefit of priority from prior Japanese Patent Application No. 2011-016245, filed Jan. 28, 2011, the entire contents of which are incorporated herein by reference.

FIELD

Embodiments described herein relate generally to, for example, a semiconductor memory device.

BACKGROUND

With progress in scaling, the variations in element characteristics increase due to variations resulting from factors associated with a process of manufacturing transistor elements which form a semiconductor memory device.

Therefore, in, for example, an SRAM (Static Random Access Memory), the variation in cell current used to charge/discharge bit lines, and that in bit line delay time distribution are likely to become significant.

BRIEF DESCRIPTION OF THE DRAWINGS

FIG. 2 is an equivalent circuit diagram showing a memory cell (SRAM cell) according to the first embodiment;

FIG. 3 is an equivalent circuit diagram illustrating an example of the arrangement of a limiter according to the first embodiment;

FIG. 6 is an equivalent circuit diagram illustrating an example of the arrangement of a limiter according to the second embodiment;

FIG. 7 is an equivalent circuit diagram illustrating an example of the arrangement of a limiter according to the third embodiment;

FIG. 11 is a distribution diagram of bit line delay in data read of a semiconductor memory device according to Comparative Example 2;

FIG. 17 is a block diagram showing a memory macro of a semiconductor memory device according to the eighth embodiment;

FIG. 22 is an equivalent circuit diagram showing a memory cell (Pch-Xfer cell) according to the ninth embodiment.

DETAILED DESCRIPTION

Figure 1:
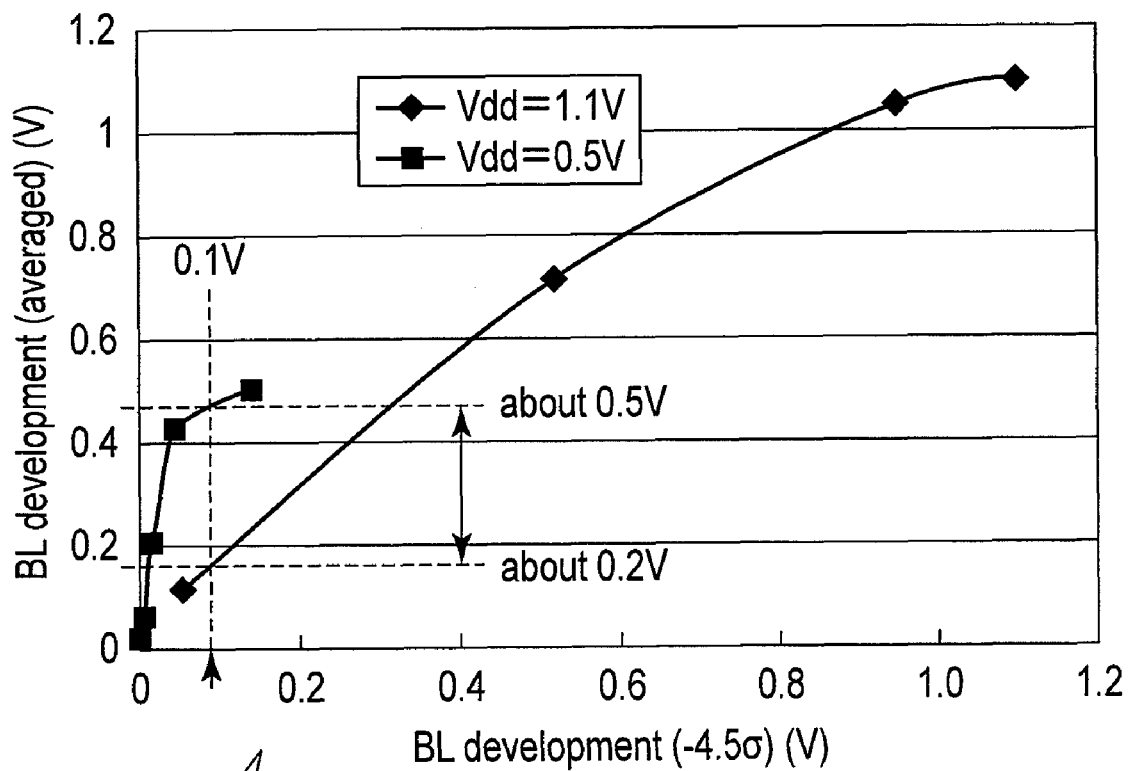
FIG. 1 is a graph showing the relationship between the bit line minimum amplitude and average amplitude according to Comparative Example 1.

In general, according to one embodiment, a semiconductor memory device includes a plurality of memory cells each of which is arranged at the intersection position between a pair of complementary bit lines and a word line, and stores data between a first power supply voltage applied to a first node and a voltage applied to a virtual ground node; and a limiter which has its input and output interposed between the virtual ground node and a second power supply node, and its control terminals connected to the pair of bit lines, and monitors the amplitude of the pair of bit lines to limit the current path to the second power supply voltage when a sufficient amplitude is generated on the pair of bit lines.

The embodiments will be described below with reference to the accompanying drawings. Note that in the following description, the same reference numerals denote the same parts throughout the drawings.

[Comparative Example 1]

To make a comparison with semiconductor memory devices according to the embodiments, Comparative Example 1 will be described first with reference to FIG. 1. A semiconductor memory device will be described hereinafter by taking an SRAM (Static Random Access Memory) as an example.

As the variations in characteristics of transistor elements which form an SRAM increase with progress in scaling, the variation in cell current used to charge/discharge bit lines becomes conspicuous.

Even when a variation in cell current occurs, problems resulting from, for example, a data read/data write operation can be coped with by setting the ON timing of a sense amplifier in accordance with the operating speed of the worst cell on the bit lines. However, in this case, when memory cells other than the worst cell charge/discharge the bit lines, the ON timing of the sense amplifier becomes too late. As a result, excessive power is consumed as too large an amplitude is generated on the bit lines, so Comparative Example 1 is disadvantageous in reducing the power consumption.

Hence, to achieve low power consumption, it seems possible to reduce the power supply voltage applied to each memory cell. This method will be described in more detail with reference to FIG. 1. FIG. 1 is a graph showing the relationship between the bit line minimum amplitude and average amplitude according to Comparative Example 1.

As can be seen from FIG. 1, the difference between the minimum amplitude and the average amplitude ΔVbl is larger when the power supply voltage Vdd is 0.5 V than when the power supply voltage Vdd is 1.1 V. This implies that the operating power does not decrease in proportion to the square of the power supply voltage Vdd even if the power supply voltage Vdd is simply dropped to reduce the power consumption, unlike the common belief.

For example, the power consumption of the bit lines is given by:

$$\tfrac{1}{2} \times C \times Vdd \times \Delta Vbl \qquad \text{expression (1)}$$

where C is the capacitance of the bit lines.

More specifically, substituting the power supply voltages (Vdd=0.5 V, 1.1 V) shown in FIG. 1 into expression (1) yields:

0.125 C when Vdd=0.5 V 0.110 C when Vdd=1.1 V

As can be seen from this result, the power consumption of the bit lines increases even when the power supply voltage is dropped to about a half (Vdd: from 1.1 V to 0.5 V).

In this manner, it is obvious that the operating power does not decrease in proportion to the square of the power supply voltage even if the power supply voltage is simply dropped to reduce the power consumption, unlike the common belief.

Note that the SRAM consumes power mainly for charge/discharge of the bit lines upon its operation. Accordingly, the above-mentioned problem is posed probably because the average bit line amplitude upon operating the SRAM increases too much due, for example, to a variation in cell current Icell resulting from, for example, a low voltage.

Hence, the following embodiments propose the use of bit line limiters (to be simply referred to as limiters hereinafter) which monitor and limit the amplitude of bit lines so that it does not become larger than necessary when a sufficient amplitude is generated on the bit lines upon operating the semiconductor memory device.

The embodiments will be described below with reference to the accompanying drawings. Note that in the following description, the same reference numerals denote the same parts throughout the drawings.

[First Embodiment]

<1. Arrangement Example>

A semiconductor memory device according to the first embodiment will be described with reference to FIGS. 2, 3, 4, and 5.

1-1. Example of Arrangement of Memory Cell (SRAM Cell)

An example of the arrangement of a memory cell (SRAM cell) according to the first embodiment will be described first with reference to FIG. 2. A memory cell MC according to this embodiment stores data between an internal power supply voltage Vdd applied to a node 1N (first node) and a voltage applied to a virtual ground node VN.

The memory cell MC is formed from MOS transistors P1 to N4, as shown in FIG. 2. That is, the memory cell MC includes the transfer transistors N1 and N2, and inverter circuits 10-1 and 10-2 connected in a flip-flop configuration so as to store data.

The transfer transistor N1 has a current path with its one end connected to a bit line BLt, and its other end connected to a node NDt of the inverter circuit 10-1, and has its gate connected to a word line WL. The transfer transistor N2 has a current path with its one end connected to a bit line BLc, and its other end connected to a node NDc of the inverter circuit 10-2, and has its gate connected to the word line WL.

The inverter circuit 10-1 includes the load transistor P1 and driver transistor N3. The driver transistor N3 has a current path with its one end connected to the virtual ground node VN, and its other end connected to one end of the load transistor P1 at the node NDt, and has its gate connected to the gate of the load transistor P1 and the node NDc of the inverter circuit 10-2. The current path of the load transistor P1 has its other end connected to the internal power supply voltage Vdd.

The inverter circuit 10-2 includes the load transistor P2 and driver transistor N4. The driver transistor N4 has a current path with its one end connected to the virtual ground node VN, and its other end connected to one end of the current path of the load transistor P2 at the node NDc, and has its gate connected to the gate of the load transistor P2 and the node NDt of the inverter circuit 10-1. The current path of the load transistor P2 has its other end connected to the internal power supply voltage Vdd.

A limiter 11 has its input and output interposed between the virtual ground node VN and a ground power supply voltage $V_{SS}$, and its control terminals connected to the bit lines BLt and BLc. With the above-mentioned arrangement, the limiter 11 monitors and limits the amplitude of the bit lines BLt and BLc so that it does not become larger than necessary when a sufficient amplitude is generated on the bit lines BLt and BLc upon operating the semiconductor memory device. Details will be described later.

Although the limiter 11 is arranged for each memory cell MC in this embodiment, the limiter 11 is not limited to this. For example, the limiter 11 may be arranged for each set of a plurality of memory cells or for each column in a memory macro. Details will be described later.

1-2. Example of Arrangement of Limiter

An example of the arrangement of the limiter according to the first embodiment will be described next with reference to FIG. 3.

The limiter 11 according to the first embodiment is formed from nMOS transistors N11 and N12, as shown in FIG. 3.

The nMOS transistors N11 and N12 have current paths connected in series between the virtual ground node VN and the ground power supply voltage $V_{SS}$. The nMOS transistor N11 has its gate connected to the bit line BLc. The nMOS transistor N12 has its gate connected to the bit line BLt.

<2. Operation (Data Read/Data Write Operation)>

The operation of the semiconductor memory device according to the first embodiment will be described next with reference to FIG. 4. The voltage relationship of a selected memory cell (selected MC) in a data read/data write operation will be taken as an example herein.

Figure 4:
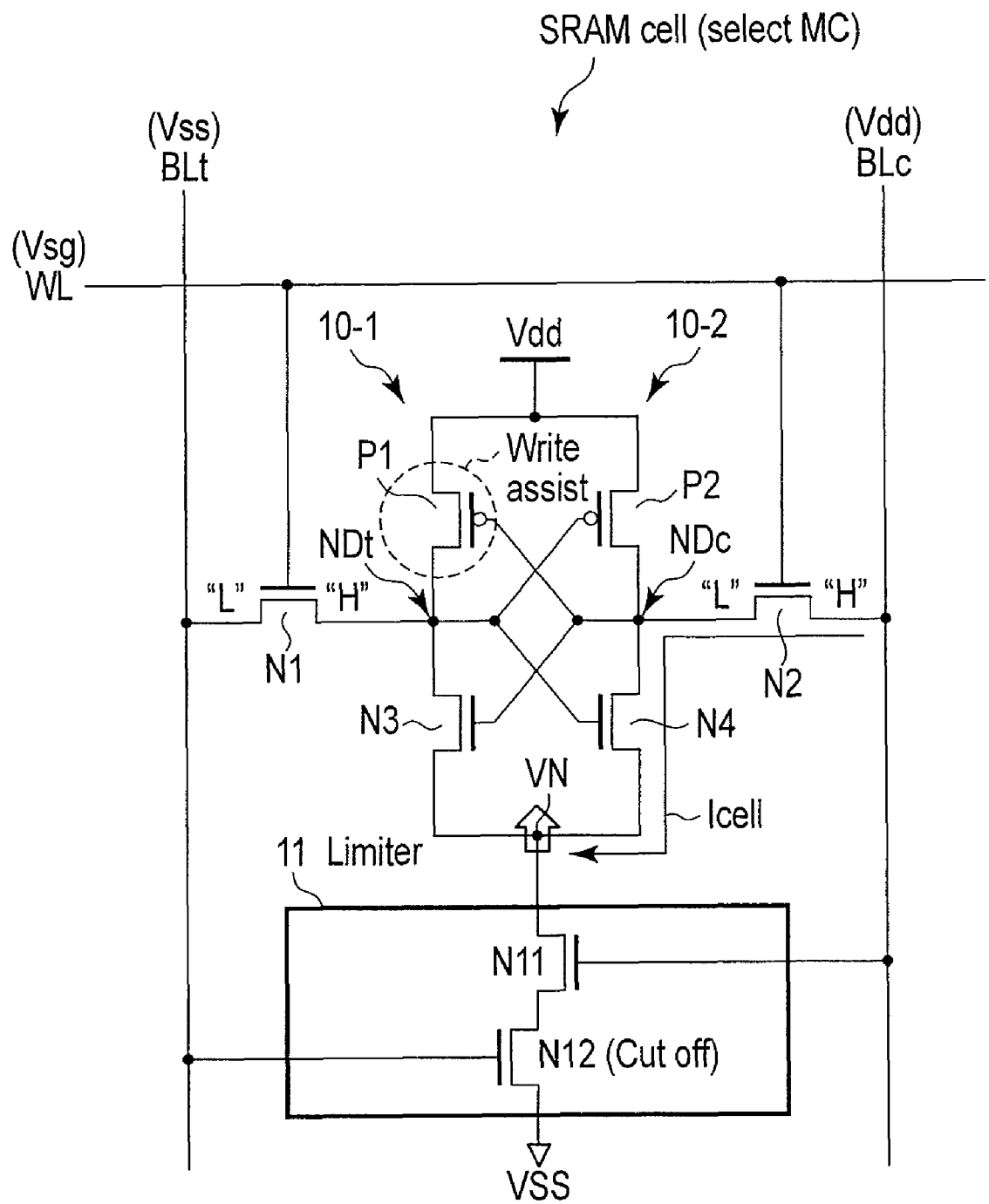
FIG. 4 is an equivalent circuit diagram showing the voltage relationship of a memory cell in data read or data write according to the first embodiment.

In the selected memory cell (selected MC) in, for example, a data read operation, the bit line BLc is applied with "H" level (Vdd), its complementary bit line BLt is applied with "L" level (Vss), and the word line is applied with a select voltage (Vsg), as shown in FIG. 4.

The transistors N2 and N4 are then enabled (turned on), so a cell current Icell flows between the bit line BL and the limiter 11 via the current paths of the transistors N2 and N4. By detecting the cell current Icell using a sense amplifier (not shown) electrically connected to the bit line BL, data read is performed.

When an amplitude sufficient for data read is generated between the bit lines BLc and BLt, the voltage across the bit lines BLc and BLt is inverted, so one (the transistor N12 in this embodiment) of the nMOS transistors N11 and N12 in the limiter 11 cuts off the current path to the ground power supply voltage $V_{SS}$. This makes it possible to limit the flow of the cell current Icell afterward.

In this manner, the limiter 11 according to this embodiment can monitor and limit the amplitude of the bit lines BLc and BLt so that it does not become larger than necessary when a sufficient amplitude is generated on the bit lines BLc and BLt upon operating the semiconductor memory device.

In addition, in the voltage relationship shown in FIG. 4, the virtual ground node VN assumes a floating state, so its potential is raised by the cell current Icell. Therefore, by lowering the driving capacity of the pMOS transistor P1 indicated by a broken line in FIG. 4 in a data write operation, data write assist can be performed.

<3. Effect>

Using the semiconductor memory device according to the first embodiment, at least the following effects (1) to (3) can be obtained:

(1) It is possible to achieve low power consumption.

As described above, the semiconductor memory device according to this embodiment includes the limiter 11 having its input and output interposed between the virtual ground node VN and the ground power supply voltage $V_{SS}$, and its control terminals connected to the bit lines BLt and BLc. The limiter 11 can monitor and limit the amplitude of bit lines so that it does not become larger than necessary when a sufficient amplitude is generated on the bit lines upon operating the semiconductor memory device, thereby cutting excessive power consumption on the bit lines due to charge/discharge.

For example, as shown in FIG. 4, when an amplitude sufficient for data read is generated between the bit lines BLc and BLt, the voltage across the bit lines BLc and BLt is inverted, so one (the transistor N12 in this embodiment) of the nMOS transistors N11 and N12 in the limiter 11 cuts off the current path to the ground power supply voltage $V_{SS}$. This makes it possible to limit the flow of the cell current Icell afterward. In other words, when the amplitude level between the bit lines BLc and BLt changes to that at which the nMOS transistors N11 and N12 are to be cut off, the cell current Icell is cut off and therefore does not flow too much.

In this manner, according to the first embodiment, it is possible to limit the amplitude of the bit lines so that it does not become larger than necessary, and, in turn, to limit the flow of the cell current Icell so that it does not become higher than necessary, thus achieving low power consumption, regardless of the value of the input power supply voltage Vdd.

Therefore, by decreasing the value of the power supply voltage Vdd applied to the memory cell MC, the power consumption can also be reduced in accordance with expression (1).

In addition, according to the first embodiment, this effect can be obtained regardless of a variation in cell current Icell with advances in micropatterning.

This means that the first embodiment is advantageous in advancing micropatterning.

(2) The first embodiment is advantageous in attaining an operation speedup.

Also, the nMOS transistors N11 and N12 in a memory cell MC in which a sufficient amplitude is not generated between the bit lines BLc and BLt are not cut off, so the limiter 11 does not limit the amplitude of the bit lines BLt and BLc. Therefore, the operating speed of a memory cell (worst cell) that operates at a lowest speed hardly slows down, so no operation delay occurs.

Figure 5:
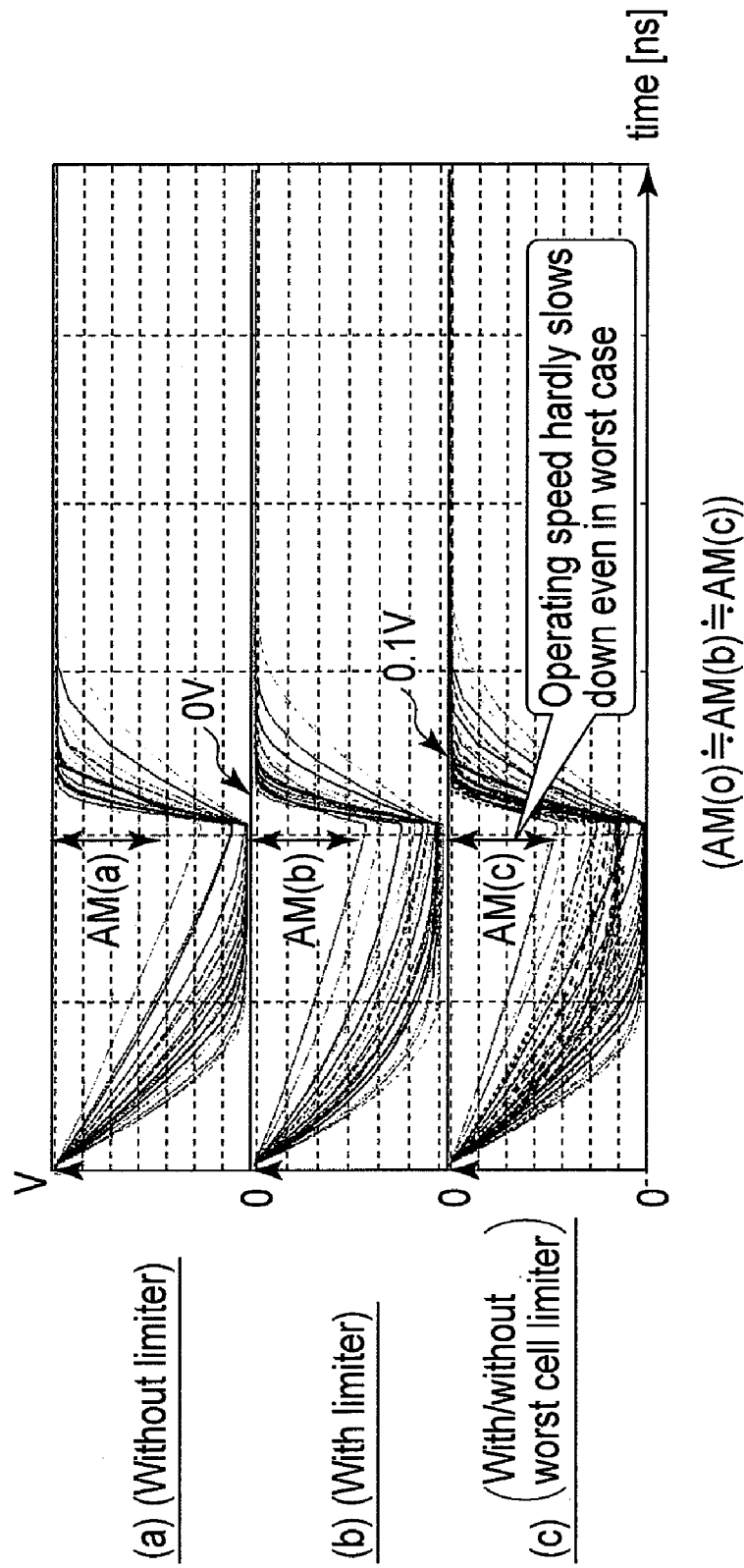
FIG. 5 is a graph associated with the operating speed of a semiconductor memory device according to the first embodiment.

This operating speed, for example, will be described with reference to FIG. 5. Referring to FIG. 5, (a) shows a case in which the limiter 11 according to the first embodiment is not provided, (b) shows a case in which the limiter 11 according to the first embodiment is provided, and (c) shows a case in which the limiter 11 according to the first embodiment is provided/not provided to a memory cell (worst cell) that operates at a lowest speed.

In all the cases shown in (a) to (c), the bit lines ensure a sufficient amplitude (AM(a)=AM(b)=AM(c)) at nearly the same time, as shown in FIG. 5. Therefore, the operating speed of even a memory cell (worst cell) that operates at a lowest speed in (c) of FIG. 5 hardly slows down.

In this manner, the semiconductor memory device according to the first embodiment is advantageous in attaining an operation speedup as well.

(3) It is possible to improve the data write characteristics.

In addition, in the voltage relationship shown in FIG. 4, the virtual ground node VN assumes a floating state even in a data write operation, so its potential is raised by the cell current Icell. Therefore, in a data write operation, by lowering the driving capacity of the pMOS transistor P1 indicated by a broken line in FIG. 4, a data write assist can be performed. In other words, upon forcing the amplitude corresponding to data toward one of the bit lines BLc and BLt by the write transistor, the virtual ground node VN floats, so a write assist can be performed as well. As a result, the data write characteristics can be improved.

Moreover, the transistors N11 and N12 are cut off only after a sufficient amplitude is generated on the bit lines BLc and BLt, so the stability of the accessed memory cell does not degrade.

[Second Embodiment (Another Example of Limiter)]

A semiconductor memory device according to the second embodiment will be described next with reference to FIG. 6. This embodiment relates to another example of the arrangement of a limiter. The same parts as in the first embodiment will not be described in detail hereinafter.

<Example of Arrangement of Limiter>

An example of the arrangement of a limiter 11 according to the second embodiment will be described with reference to FIG. 6.

The limiter 11 according to the second embodiment is different from that according to the first embodiment in that the former includes nMOS transistors N21 and N22, as shown in FIG. 6.

The nMOS transistors N21 and N22 have current paths connected in parallel between a virtual ground node VN and a ground power supply voltage $V_{SS}$. The nMOS transistor N21 has its gate connected to a bit line BLc. The nMOS transistor N22 has its gate connected to a bit line BLt.

<Operation>

In, for example, a data read operation, when an amplitude necessary for the bit lines BLc and BLt is generated, one of the nMOS transistors N21 and N22 which form a parallel circuit is cut off to reduce the driving force of the cell current. In this manner, in the second embodiment, the power consumption can be reduced by decreasing the cell current, although the cell current is not completely cut off.

Other arrangements, operations, etc. are practically the same as in the first embodiment.

<Effect>

As described above, using the semiconductor memory device according to the second embodiment, at least effects (1) to (3) as mentioned above can be obtained.

Note that a limiter formed from a pair of stacked transistors N11 and N12 has been exemplified as the limiter according to the first embodiment. In this arrangement, the transistors N11 and N12 have different back gate voltages, so the operation of the limiter 11 may slightly vary in each individual data to be read.

In contrast to this, in the limiter 11 according to the second embodiment, the transistors N21 and N22 have current paths connected in parallel between the virtual ground node VN and the ground power supply voltage $V_{SS}$. Therefore, the transistors N21 and N22 can have the same back gate voltage, so the operation of the limiter 11 is unlikely to slightly vary in each individual data to be read. In this respect, the second embodiment is more favorable than the first embodiment.

[Third Embodiment (Still Another Example of Limiter)]

A semiconductor memory device according to the third embodiment will be described next with reference to FIG. 7. This embodiment relates to still another example of a limiter. The same parts as in the first embodiment will not be described in detail hereinafter.

<Example of Arrangement of Limiter>

An example of the arrangement of a limiter 11 according to the third embodiment will be described with reference to FIG. 7.

The limiter 11 according to the third embodiment is different from that according to the first embodiment in that the former includes nMOS transistors N31, N32, N33, and N34, as shown in FIG. 7.

The nMOS transistors N31 and N32 have current paths connected in series between a virtual ground node VN and a ground power supply voltage $V_{SS}$. The nMOS transistor N31 has its gate connected to a bit line BLt. The nMOS transistor N32 has its gate connected to a bit line BLc.

The nMOS transistors N33 and N34 have current paths connected in series between the virtual ground node VN and the ground power supply voltage $V_{SS}$. The nMOS transistor N33 has its gate connected to the bit line BLc. The nMOS transistor N34 has its gate connected to the bit line BLt.

Other arrangements, operations, etc. are practically the same as in the first embodiment.

<Effect>

As described above, using the semiconductor memory device according to the third embodiment, at least effects (1) to (3) as mentioned above can be obtained.

Note that when the limiter 11 monitors the potentials of the bit lines BLc and BLt and even cuts off the transistors in the limiter 11, charge sharing occurs between the capacitance of the virtual ground node VN and that of the bit lines BLc and BLt. In this case, therefore, the bit lines BLc and BLt may be charged/discharged even after the cutoff so that the effect of reducing the power consumption lessens.

To prevent this, it is necessary to set the capacitance of the virtual ground node VN lower than that of the bit lines BLc and BLt.

Hence, in the limiter 11 according to the third embodiment, two or more transistors N31, N32, N33, and N34 are arranged for each pair of bit lines BLc and BLt, thereby making it possible to decrease the ratio between the capacitance of the virtual ground node VN and that of the bit lines BLc and BLt, compared to the first and second embodiments. This makes it possible to prevent the occurrence of charge sharing between the capacitance of the virtual ground node VN and that of the bit lines BLc and BLt. Therefore, the third embodiment is more advantageous in reducing the power consumption than the first and second embodiments.

[Fourth Embodiment (Still Another Example of Limiter)]

A semiconductor memory device according to the fourth embodiment will be described next with reference to FIG. 8. This embodiment relates to still another example of a limiter. The same parts as in the first embodiment will not be described in detail hereinafter.

<Example of Arrangement of Limiter>

An example of the arrangement of a limiter 11 according to the fourth embodiment will be described with reference to FIG. 8.

Figure 8:
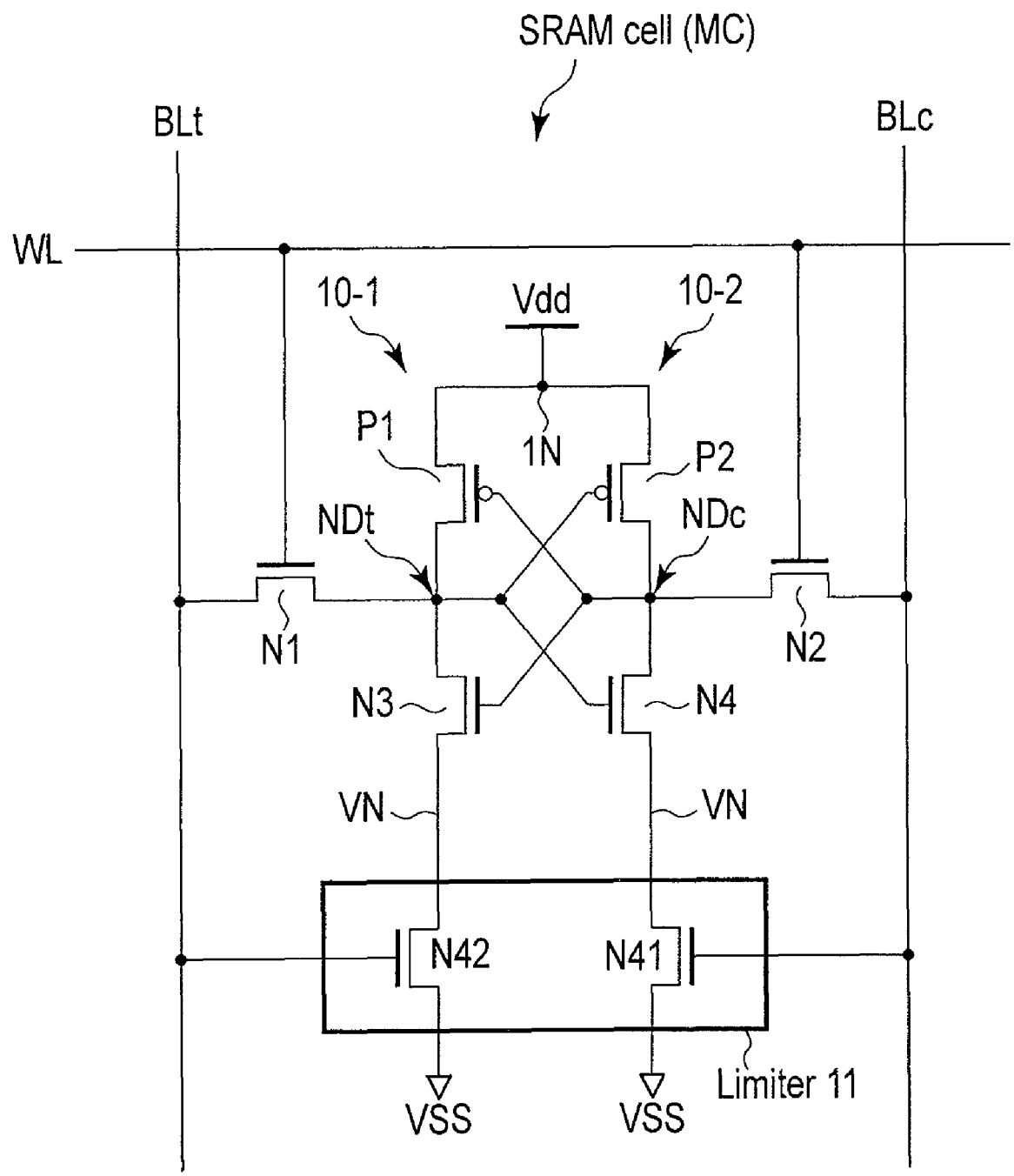
FIG. 8 is an equivalent circuit diagram illustrating an example of the arrangement of a limiter according to the fourth embodiment.

The limiter 11 according to the fourth embodiment is different from that according to the first embodiment in that the former includes nMOS transistors N41 and N42, as shown in FIG. 8.

The nMOS transistor N41 has a current path with its one end connected to a ground power supply voltage $V_{SS}$, and its other end connected to one end of the current path of a transistor N4 in a memory cell MC, and has its gate connected to a bit line BLc. The nMOS transistor N42 has a current path with its one end connected to the ground power supply voltage $V_{SS}$, and its other end connected to one end of the current path of a transistor N3 in the memory cell MC, and has its gate connected to a bit line BLt.

Other arrangements, operations, etc. are practically the same as in the first embodiment.

<Effect>

As described above, using the semiconductor memory device according to the fourth embodiment, at least effects (1) to (3) as mentioned above can be obtained.

Moreover, the arrangement of the limiter 11 as in this embodiment can be adopted as needed.

[Fifth Embodiment (Example in which Limiter is Arranged for Each Column)]

A semiconductor memory device according to the fifth embodiment will be described next with reference to FIGS. 9 and 10. This embodiment relates to an example in which a plurality of limiters are arranged for each column. The same parts as in the first embodiment will not be described in detail hereinafter.

<Limiter>

A limiter 11 according to the fifth embodiment will be described with reference to FIG. 9.

Figure 9:
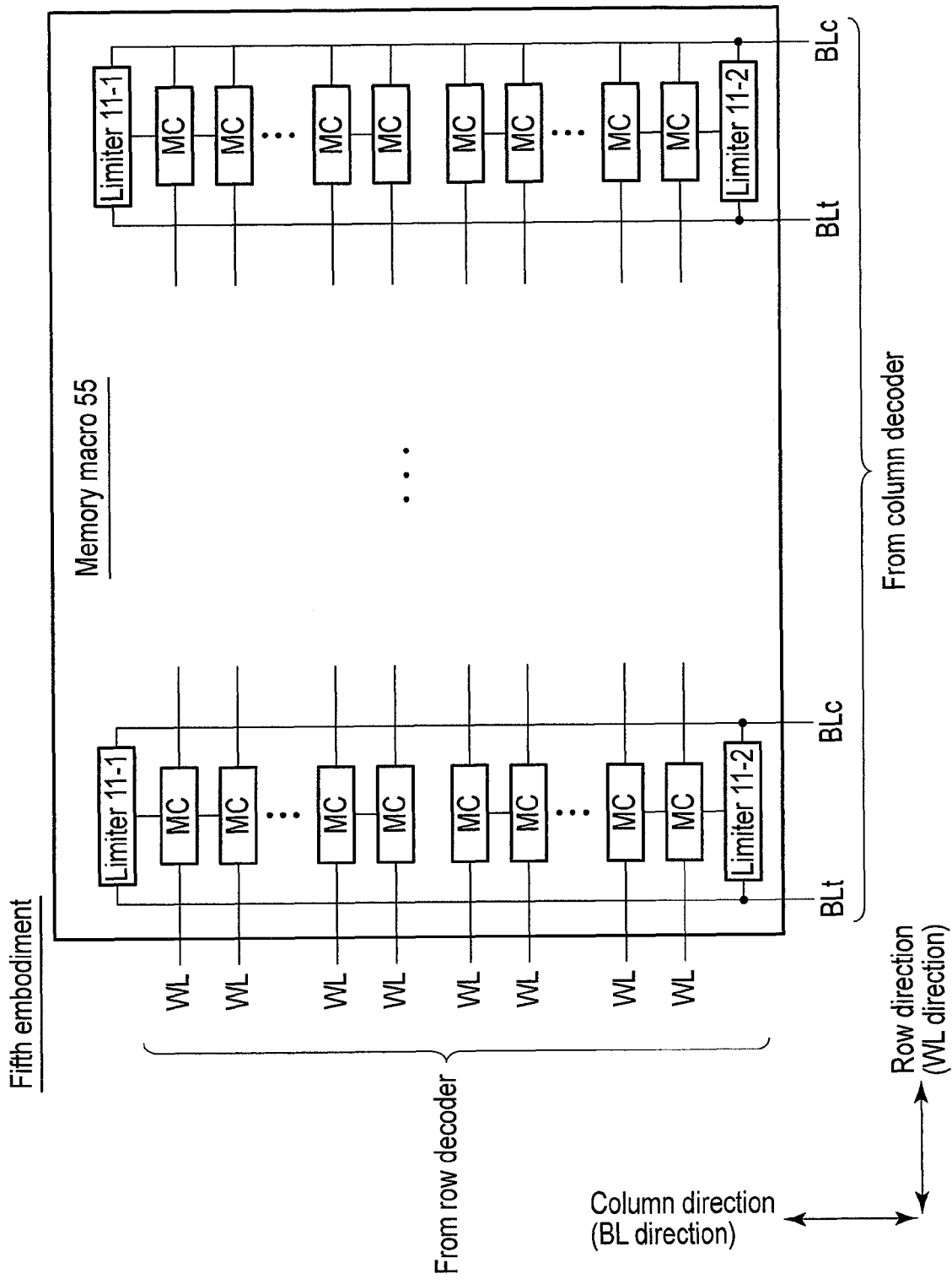
FIG. 9 is a block diagram illustrating an example of the arrangement of a memory macro of a semiconductor memory device according to the fifth embodiment.

The semiconductor memory device according to the fifth embodiment is different from those according to the above-described embodiments in that in the former two limiters 11-1 and 11-2 are arranged at the two ends, respectively, of each column of a memory macro 55 formed by arranging a plurality of memory cells MC in a matrix, as shown in FIG. 9.

The memory macro 55 includes the plurality of memory cells MC (SRAM cells) arranged at the intersection positions between a plurality of word lines WL and a plurality of pairs of bit lines BLt and BLc. The plurality of word lines WL are selected by a row decoder (not shown). The plurality of pairs of bit lines BLt and BLc are selected by a column decoder (not shown) and electrically connected to a sense amplifier.

The limiters 11-1 and 11-2 can adopt either of the arrangement examples according to the first to fourth embodiments as needed.

Although an example in which the two limiters 11-1 and 11-2 are arranged at the two ends, respectively, of each column of the memory macro 55 has been given herein, the embodiment is not limited to this. For example, one limiter 11 may be arranged for each column, or one limiter 11 may be arranged for each set of a plurality of columns (for example, every 16 or 32 columns).

<Operation (Data Read/Data Write Operation)>

The operation of the semiconductor memory device according to the fifth embodiment will be described next with reference to FIG. 10. The voltage relationship of a selected memory cell (selected MC) and non-selected memory cell (non-selected MC) in a data read/data write operation will be taken as an example herein.

Figure 10:
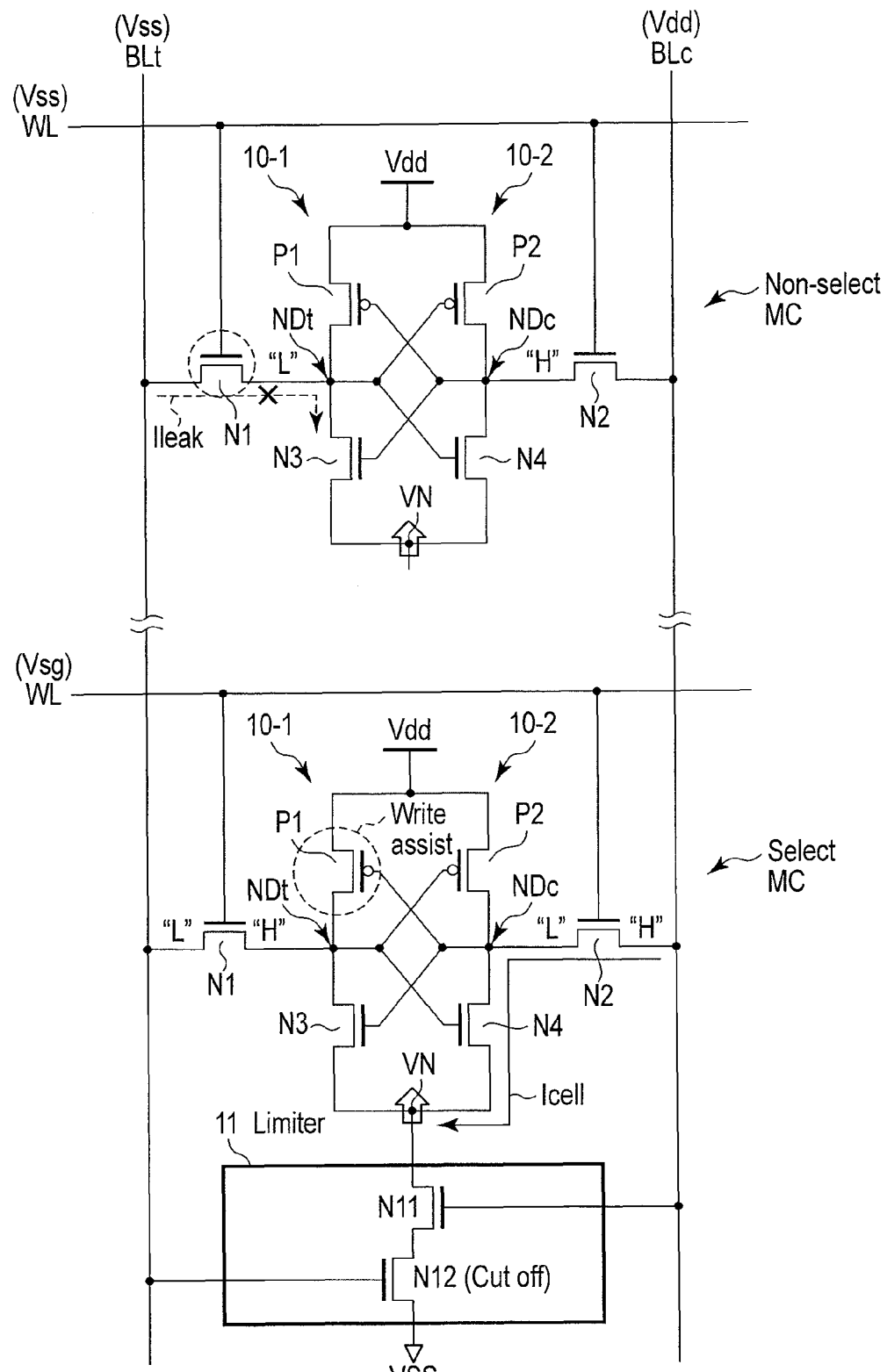
FIG. 10 is an equivalent circuit diagram showing the voltage relationship of selected/non-selected memory cells in data read or data write according to the fifth embodiment.

As shown in FIG. 10, in the selected memory cell (selected MC), the bit lines BLc and BLt and word lines WL are applied with the same voltages as mentioned above.

In the non-selected memory cell (non-selected MC), the bit line BLc is applied with "H" level (Vdd), and the bit line BLt is applied with "L" level (Vss), in the same way as mentioned above, but the word line WL is applied with a non-select voltage (Vss).

Moreover, the limiter 11 common to the selected memory cell and the non-selected memory cell is arranged. Therefore, when a transistor N12 in the limiter 11 is cut off, the potential of a virtual ground node VN of the non-selected MC connected commonly to the selected MC naturally rises.

This means that the source potential of the non-selected MC also rises, thus making it possible to decrease a leakage current Ileak flowing through the current path of a transistor N1 of the non-selected MC indicated by a broken line in FIG. 10. As a result, the fifth embodiment is more advantageous in reducing the power consumption than the above-described embodiments.

Other arrangements, operations, etc. are practically the same as in the first embodiment.

<Effect>

As described above, using the semiconductor memory device according to the fifth embodiment, at least effects (1) to (3) as mentioned above can be obtained.

Moreover, in the semiconductor memory device according to the fifth embodiment, the two limiters 11-1 and 11-2 are arranged at the two ends, respectively, of each column of the memory macro 55 formed by arranging the plurality of memory cells MC in a matrix.

Therefore, when the transistor N12 in the limiter 11 is cut off, the potential of the virtual ground node VN of the non-selected MC connected commonly to the selected MC naturally rises.

This means that the source potential of the non-selected MC also rises, thus making it possible to reduce the leakage current Ileak flowing through the current path of the transistor N1 of the non-selected MC indicated by a broken line in FIG. 10. As a result, the fifth embodiment is more advantageous in reducing the power consumption than the above-described embodiments.

In addition, the plurality of memory cells MC can share the limiter 11, so the fifth embodiment is more advantageous in advancing micropatterning than the above-described embodiments.

Also, the arrangement of the memory cell MC (SRAM cell) is not limited to the above-mentioned one. For example, an arrangement in which the transfer transistors N1 and N2 which form the memory cell MC have the opposite conductivity type (p type) can similarly be adopted, as will be described later. In this case, the transistors which form the limiter 11 also have the opposite conductivity type (p type), so not the ground power supply voltage $V_{SS}$ but the internal power supply voltage Vdd serves as a power supply voltage applied to the virtual ground node VN.

[Comparative Example 2]

To make a comparison with semiconductor memory devices according to the following sixth to ninth embodiments, Comparative Example 2 will be described herein with reference to FIG. 11.

As described above, with progress in scaling and an increase in capacitance, the variations in element characteristics increase due to variations resulting from factors associated with a process of manufacturing transistor elements which form a semiconductor memory device. Therefore, in, for example, an SRAM (Static Random Access Memory), the variation in cell current used to charge/discharge bit lines, and that in bit line delay time distribution are likely to become significant.

This fact will be explained in more detail with reference to FIG. 11. FIG. 11 shows the bit line delay time distribution in data read using a σ (sigma) plot. The bit line delay time means herein the time taken to generate an amplitude necessary to read out data on a specific bit line. The delay time has a given distribution due to random variations in characteristics of the transistor elements, as shown in FIG. 11. The delay time is strongly influenced by the variations in characteristics of the transistor elements especially when both the power supply voltage and the word line potential are low.

For example, referring to FIG. 11, $-4\sigma$ (a slowest memory cell (worst case)) has a timing of about 2.6 (μs), $-3\sigma$ (a medium-speed memory cell) has a timing of about 0.7 (μs), and $-2\sigma$ (a fastest memory cell) has a timing of about 0.2 (μs). In this manner, the delay time of a bit line having $-4\sigma$ (the slowest memory cell ((worst case))) is about three and seven times those of bit lines having $-3\sigma$ and $-2\sigma$, respectively.

Hence, as long as slow memory cells exemplified above can be compensated for in some way, the read speed of an SRAM chip can be improved to three and seven times, respectively. In addition, because at a low voltage, the power consumption by the leakage current is the major component of the total power consumption, an improvement in read speed at a low voltage contributes not only to an improvement in operating frequency but also to a reduction in power consumption per operation.

It seems possible to compensate for slow cells simply by, for example, replacing them with redundant cells in redundancy. However, when, for example, $-3\sigma$ (middle-speed memory cell) shown in FIG. 11 is to be compensated for, 1.3 cells must be compensated per 1,000 cells. Therefore, application of this compensation process to a 1-Mb memory macro (cell array) requires redundant cells for use in redundancy of 1,300 sets. As a result, the occupied area of the memory cells increases, thus making it practically impossible to implement this compensation process due to concerns for their area overhead.

Hence, the following sixth to ninth embodiments propose semiconductor memory devices each including a power supply booster which monitors the amplitude of bit lines, and individually boosts the power supply voltages of memory cells (slow cells) having insufficient bit line amplitudes in, for example, data read.

[Sixth Embodiment]

<11. Arrangement Example>

A semiconductor memory device according to the sixth embodiment will be described with reference to FIGS. 12, 13, 14, and 15.

11-1. Example of Arrangement of Memory Macro

A memory macro (memory cell array) of the semiconductor memory according to the sixth embodiment will be described first with reference to FIG. 12.

Figure 12:
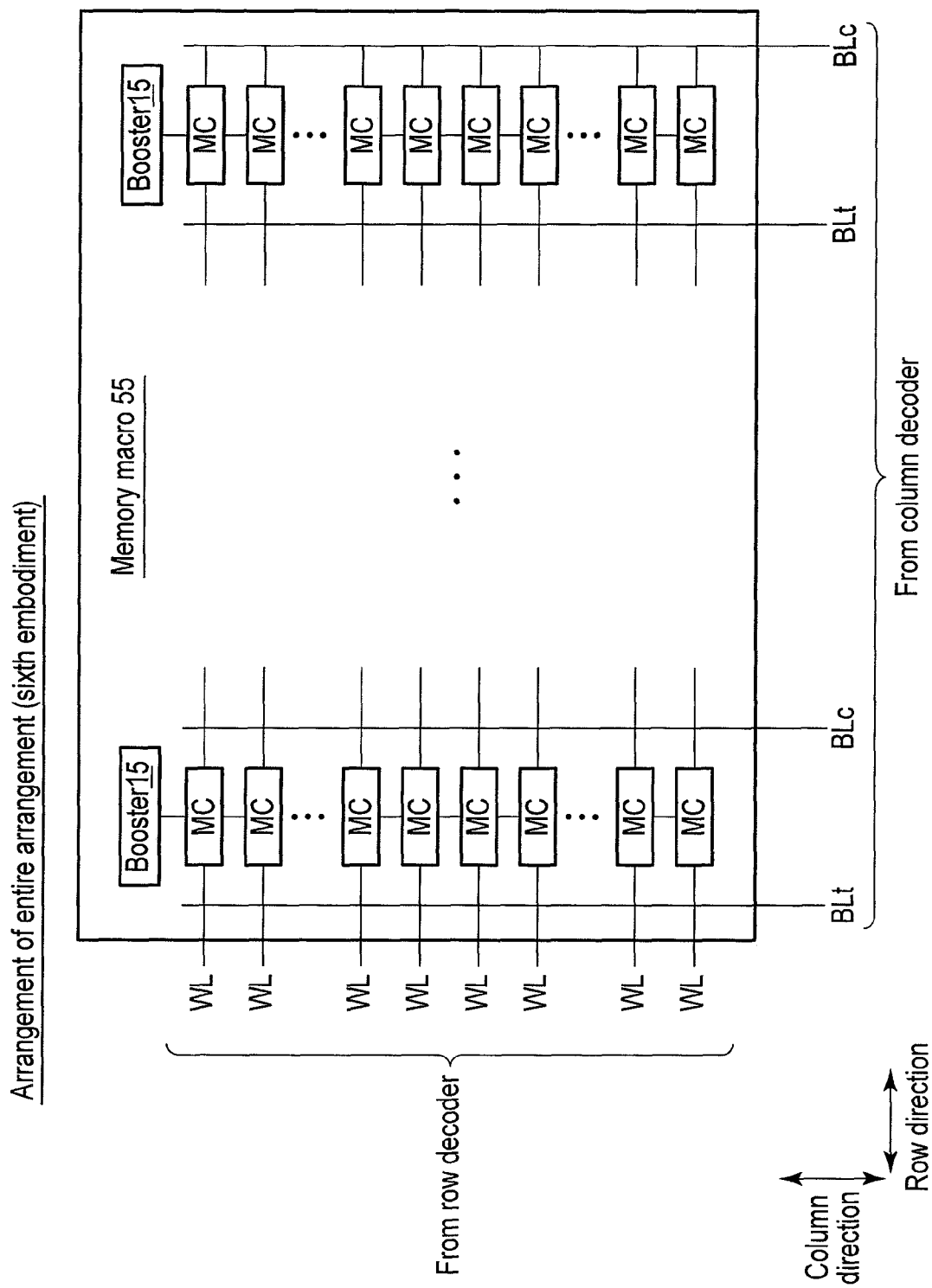
FIG. 12 is a block diagram showing a memory macro of a semiconductor memory device according to the sixth embodiment.

A memory macro 55 according to the sixth embodiment includes a plurality of memory cells MC (SRAM cells) arranged at the intersection positions between a plurality of word lines WL and a plurality of pairs of complementary bit lines BLt and BLc, and power supply boosters 15, as shown in FIG. 12.

The plurality of word lines WL are selected by a row decoder (not shown). The plurality of pairs of bit lines BLt and BLc are selected by a column decoder (not shown) and electrically connected to a sense amplifier.

In this embodiment, the power supply booster 15 is arranged at one end of each column, monitors the amplitude of the bit lines BLt and BLc, and individually boosts the power supply voltages of memory cells MC having insufficient bit line amplitudes in, for example, data read. Details will be described later. The power supply booster 15 is arranged commonly to column-specific memory cells, so the memory cells MC on the same column adopt the power supply booster 15 on this column.

Note that the overall semiconductor memory device including, for example, the memory macro 55 is controlled using control signals (for example, an SAE (Sense Amplifier Enable) signal and a pre-sense signal Pre_SAE signal (both will be described later) by a control circuit (sequencer; not shown).

Also, although an example in which the power supply booster 15 is arranged at one end of each column of the memory macro 55 has been given in the sixth embodiment, the present embodiment is not limited to this. For example, two power supply boosters 15 may be arranged at the two ends, respectively, of each column, or one power supply booster 15 may be arranged for each set of a plurality of columns (for example, every 16 or 32 columns).

11-2. Example of Arrangement of Memory Cell (SRAM Cell)

An example of the arrangement of the memory cell MC (SRAM cell) according to the sixth embodiment will be described next with reference to FIG. 13. The memory cell MC according to this embodiment stores data between a power supply voltage applied to a node PWN (first node) and a voltage applied to a node VN (second node). The node PWN is applied with an internal power supply voltage $V_{DD}$ or $V_{DDH}$ ($>V_{DD}$) generated by the power supply booster 15.

Figure 13:
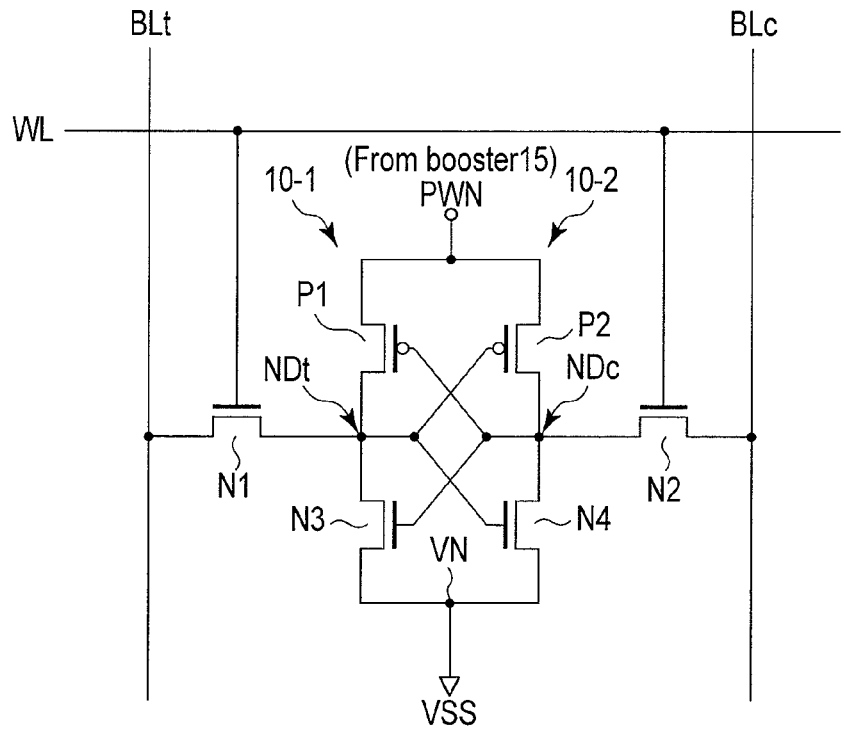
FIG. 13 is an equivalent circuit diagram showing a memory cell (SRAM cell) according to the sixth embodiment.

The memory cell MC is formed from MOS transistors P1 to N4, as shown in FIG. 13. That is, the memory cell MC includes the transfer transistors N1 and N2, and inverter circuits 10-1 and 10-2 connected in a flip-flop configuration so as to store data.

The transfer transistor N1 has a current path with its one end connected to the bit line BLt, and its other end connected to a node (latch node) NDt of the inverter circuit 10-1, and has its gate connected to the word line WL. The transfer transistor N2 has a current path with its one end connected to the bit line BLc, and its other end connected to a node (latch node) NDc of the inverter circuit 10-2, and has its gate connected to the word line WL.

The inverter circuit 10-1 includes the load transistor P1 and driver transistor N3. The driver transistor N3 has a current path with its one end connected to a ground power supply voltage $V_{SS}$ via the node VN, and its other end connected to one end of the current path of the load transistor P1 at the node NDt, and has its gate connected to the node NDc of the inverter circuit 10-2. The current path of the load transistor P1 has its other end applied with the internal power supply voltage $V_{DD}$ or $V_{DDH}$ via the node PWN.

The inverter circuit 10-2 includes the load transistor P2 and driver transistor N4. The driver transistor N4 has a current path with its one end connected to the ground power supply voltage $V_{SS}$ via the node VN, and its other end connected to one end of the current path of the load transistor P2 at the node NDc, and has its gate connected to the gate of the load transistor P2 and the node NDt of the inverter circuit 10-1. The current path of the load transistor P2 has its other end applied with the internal power supply voltage $V_{DD}$ or $V_{DDH}$ via the node PWN.

11-3. Example of Arrangement of Power Supply Booster

An example of the arrangement of the power supply booster 15 according to the sixth embodiment will be described next with reference to FIG. 14.

Figure 14:
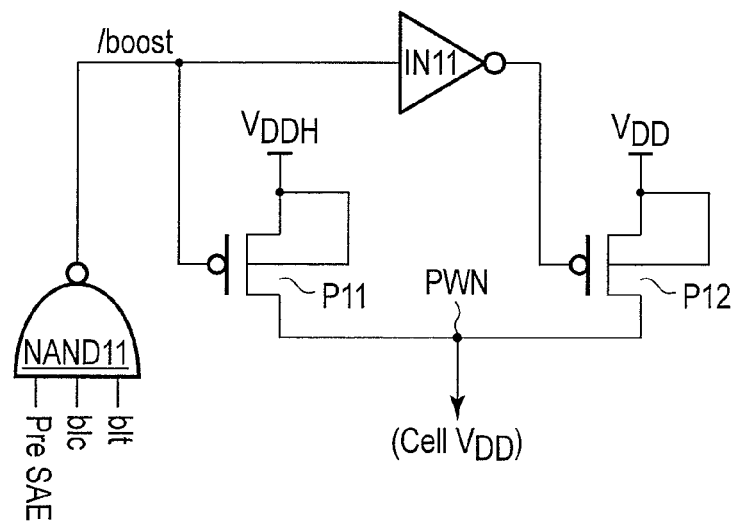
FIG. 14 is an equivalent circuit diagram showing a power supply booster according to the sixth embodiment.

The power supply booster 15 according to this embodiment includes a NAND circuit 11, an inverter IN11, and pMOS transistors P11 and P12, as shown in FIG. 14.

The NAND circuit (NAND 11) inputs potential signals blt and blc of the bit lines BLt and BLc, respectively, and outputs a boost signal /boost corresponding to an input pre-sense signal Pre_SAE.

The inverter IN11 has its input connected to the gate of the transistor P11, and its output connected to the gate of the transistor P12, and inverts and outputs the input boost signal /boost.

The pMOS transistor P11 has its back gate applied with the power supply voltage $V_{DDH}$ ($V_{DDH} > V_{DD}$) higher than the power supply voltage $V_{DD}$, and a current path with its one end applied with the power supply voltage $V_{DDH}$, and its other end which is electrically connected to the node PWN and applies the power supply voltage (Cell $V_{DDH}$) of the memory cell MC.

The pMOS transistor P12 has its back gate applied with the power supply voltage $V_{DD}$ ($V_{DD} < V_{DDH}$) lower than the power supply voltage $V_{DDH}$, and a current path with its one end applied with the power supply voltage $V_{DD}$, and its other end which is electrically connected to the node PWN and applies the power supply voltage (Cell $V_{DD}$) of the memory cell MC.

<12. Operation (Data Read Operation)>

The operation of the power supply booster 15 according to the sixth embodiment will be described next. The power supply booster 15 in a data read operation will be taken as an example herein.

First, when the data read operation of the memory macro 55 starts, the control circuit (sequencer; not shown) changes the pre-sense signal Pre_SAE to "H" level before generating an SAE (Sense Amplifier Enable) signal for enabling the sense amplifier to read, in the beginning of a read cycle.

At this time, if data read is so fast that a read signal is supplied to the bit lines BLt and BLc, the potential signal blt or blc input to the power supply booster 15 is inverted to "L" level, so the boost signal /boost remains at "H" level. Therefore, the pMOS transistor P12 is turned on and applies a power supply voltage $V_{DD}$ (Cell $V_{DD}$) as the power supply voltage of the memory cell MC via the node PWN.

In contrast to this, no read signal is supplied to the bit lines BLt and BLC on a column having a low data read speed. In this case, both the potential signals blt and blc input to the power supply booster 15 remain at "H" level, so the boost signal /boost is inverted to "L" level as the pre-sense signal Pre_SAE changes to "H" level. Therefore, the pMOS transistor P11 is turned on and applies by switching the higher power supply voltage $V_{DDH}$ (Cell $V_{DDH}$) as the power supply voltage of the memory cell MC via the node PWN.

This makes it possible to speed up data read even in slow memory cells MC (column), thus preventing bit line delay. As a result, low power consumption can be achieved.

<13. Effect>

Using the semiconductor memory device according to the sixth embodiment, at least effect (1) as mentioned above can be obtained. In addition, according to the sixth embodiment, the following effects (4) and (5) can be obtained as well:

(4) It is possible to prevent bit line delay, thus attaining an operation speedup.

As described above, the semiconductor memory device according to the sixth embodiment includes the power supply booster 15 which is arranged at one end of each column, monitors the amplitude of the bit lines BLt and BLc, and individually boosts the power supply voltages of memory cells MC having insufficient bit line amplitudes in, for example, data read.

Therefore, when the data read operation of the memory macro 55 starts, the control circuit (sequencer; not shown)

changes the pre-sense signal Pre_SAE to "H" level before generating an SAE (Sense Amplifier Enable) signal for enabling the sense amplifier to read, in the beginning of a read cycle. At this time, no read signal is supplied to the bit lines BLt and BLc including memory cells MC (column) having a low data read speed. In this case, both the potential signals blt and blc input to the power supply booster 15 remain at "H" level, so the boost signal/boost is inverted to "L" level as the pre-sense signal Pre_SAE changes to "H" level. Therefore, the pMOS transistor P11 is turned on and applies by switching the higher power supply voltage $V_{DDH}$ (Cell $V_{DDH}$) as the power supply voltage of the memory cell MC via the node PWN.

This makes it possible to speed up data read even in slow memory cells MC (column), thus preventing bit line delay.

Figure 15:
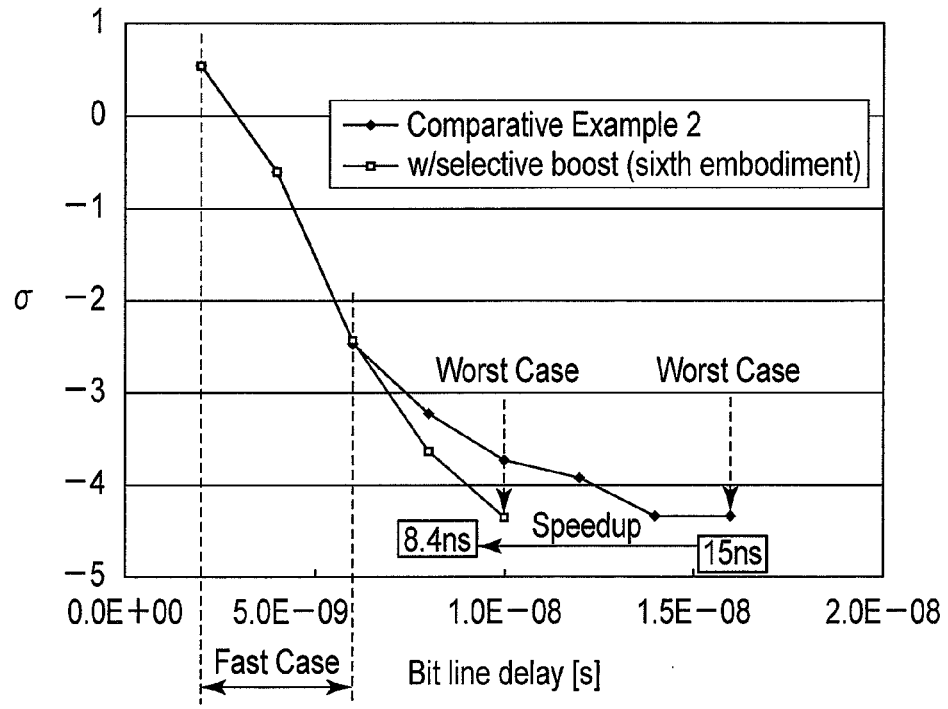
FIG. 15 is a graph showing the result of Monte Carlo simulation of the semiconductor memory device according to the sixth embodiment.

The result of Monte Carlo simulation, for example, is as shown in FIG. 15. FIG. 15 shows the bit line delay using a σ (sigma) plot.

As shown in FIG. 15, in Comparative Example 2 in which the power supply booster 15 according to the sixth embodiment is not provided, the bit line delay is about 15 ns in the slowest cell, that is, in the worst case. In contrast to this, as is obvious from FIG. 15, by providing the power supply booster 15 according to the sixth embodiment, data read speeds up to the degree that the bit line delay in the slowest cell, that is, in the worst case improves by about 8.4 ns. In this manner, in the case shown in FIG. 15, the bit line delay in the worst case can be improved so that the data read speed approximately doubles.

In addition, in relatively fast cells (fast case) of −2.5σ or less, the delay distributions in both Comparative Example 2 and the sixth embodiment overlap each other, that is, have the same distribution characteristics. Therefore, as is obvious from FIG. 15, boost of the power supply booster 15 is not active on a bit line having a sufficiently high data read speed, so wasteful power consumption is suppressed. In this respect, the sixth embodiment is advantageous in reducing the power consumption as well.

(5) The sixth embodiment is advantageous in advancing micropatterning.

As described above, in the sixth embodiment, slow memory cells are compensated for by individually boosting their power supply voltages (from $V_{DD}$ to $V_{DDH}$) by the power supply booster 15.

This obviates the need to, for example, replace slow cells with redundant cells in redundancy. For example, there is no need to provide, for example, redundant cells used in redundancy of 1,300 sets to a 1-Mb memory macro (cell array) 55, as has been described with reference to FIG. 1. In this manner, the sixth embodiment is advantageous in advancing micropatterning in terms of requiring no increase in occupied area.

[Seventh Embodiment (Another Example of Power Supply Booster)]

A semiconductor memory device according to the seventh embodiment will be described next with reference to FIG. 16. This embodiment relates to another example of the arrangement of a power supply booster. The same parts as in the sixth embodiment will not be described in detail hereinafter.

<Example of Arrangement of Power Supply Booster>

Figure 16:
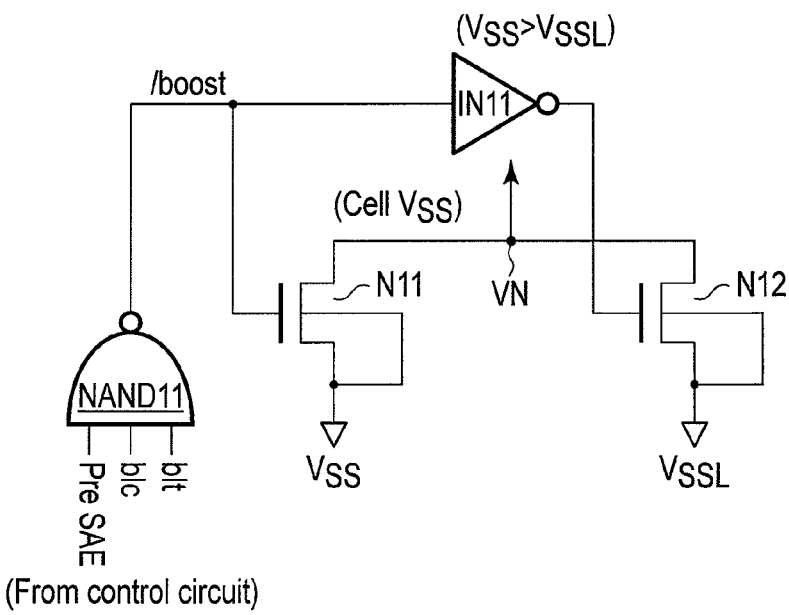
FIG. 16 is an equivalent circuit diagram showing a power supply booster according to the seventh embodiment.

A power supply booster 15 according to the seventh embodiment is different from that according to the sixth embodiment in that the former includes nMOS transistors N11 and N12, and is connected to a ground power supply voltage applied to a virtual ground node VN of a memory cell MC, as shown in FIG. 16. Therefore, a fixed power supply voltage $V_{DD}$ is applied to a node 1N in the memory cell MC.

The nMOS transistor N11 has its back gate applied with a ground power supply voltage $V_{SS}$, and a current path with its one end applied with the ground power supply voltage $V_{SS}$, and its other end which is electrically connected to a node PWN and serves as a terminal which applies the power supply voltage (Cell $V_{SS}$) of the memory cell MC.

The nMOS transistor N12 has its back gate applied with a power supply voltage $V_{SSL}$, ($V_{SSL}$, <$V_{SS}$) lower than the ground power supply voltage $V_{SS}$, and a current path with its one end applied with the power supply voltage $V_{SSL}$, and its other end which is electrically connected to the node PWN and applies the power supply voltage (Cell $V_{SSL}$) of the memory cell MC.

Other arrangements, operations, etc. are practically the same as in the sixth embodiment, and a detailed description thereof will not be given.

<Effect>

As described above, using the semiconductor memory device according to the seventh embodiment, at least effects (4) and (5) as mentioned above can be obtained.

Note that in the sixth embodiment, the power supply voltage of the memory cell MC is boosted (from $V_{DD}$ to $V_{DDH}$), so the cell current of the memory cell MC can be increased by increasing the ON currents of driver transistors N3 and N4 of the memory cell MC. Therefore, if the worst cell delays due to small ON currents of the transfer transistors N1 and N2 which form the memory cell MC, no sufficient effect may be obtained.

Hence, the power supply booster 15 according to the seventh embodiment includes the nMOS transistors N11 and N12 to switch the power supply voltage connected to the ground power supply voltage applied to the virtual ground node VN of the memory cell MC (from $V_{SS}$ to $V_{SSL}$). Therefore, the fixed internal power supply voltage $V_{DD}$ is applied to the node 1N in the memory cell MC.

The above-mentioned arrangement can improve the driving capacities of both the driver transistors N3 and N4 and transfer transistors N1 and N2 in the memory cell MC. Therefore, even if the worst cell delays due to small ON currents of the transfer transistors N1 and N2, a sufficient speedup effect can be obtained. In this respect, the seventh embodiment is more favorable than the above-described embodiments.

[Eighth Embodiment (Example in which Limiter is Further Provided)]

A semiconductor memory device according to the eighth embodiment will be described next with reference to FIGS. 17, 18, 19, 20, and 21. This embodiment relates to an example in which a bit line limiter 11 as mentioned above is further provided. The same parts as in the sixth embodiment will not be described in detail hereinafter.

<Example of Arrangement of Memory Macro 55>

An example of the arrangement of a memory macro 55 according to the eighth embodiment will be described first with reference to FIG. 17. The memory macro 55 according to this embodiment is different from that according to the sixth embodiment in that in the former the bit line limiter 11 is further arranged for each column, as shown in FIG. 17.

The limiter 11 monitors and limits the amplitude of bit lines BLc and BLt so that it does not become larger than necessary when a sufficient amplitude is generated on the bit lines BLt and BLc upon, for example, a data read operation. This makes it possible to cut excessive power consumption due to charge or discharge of the bit lines BLt and BLc upon operating the semiconductor memory device.

<Memory Cell MC>

A memory cell MC according to the eighth embodiment will be described next with reference to FIG. 18.

Figure 18:
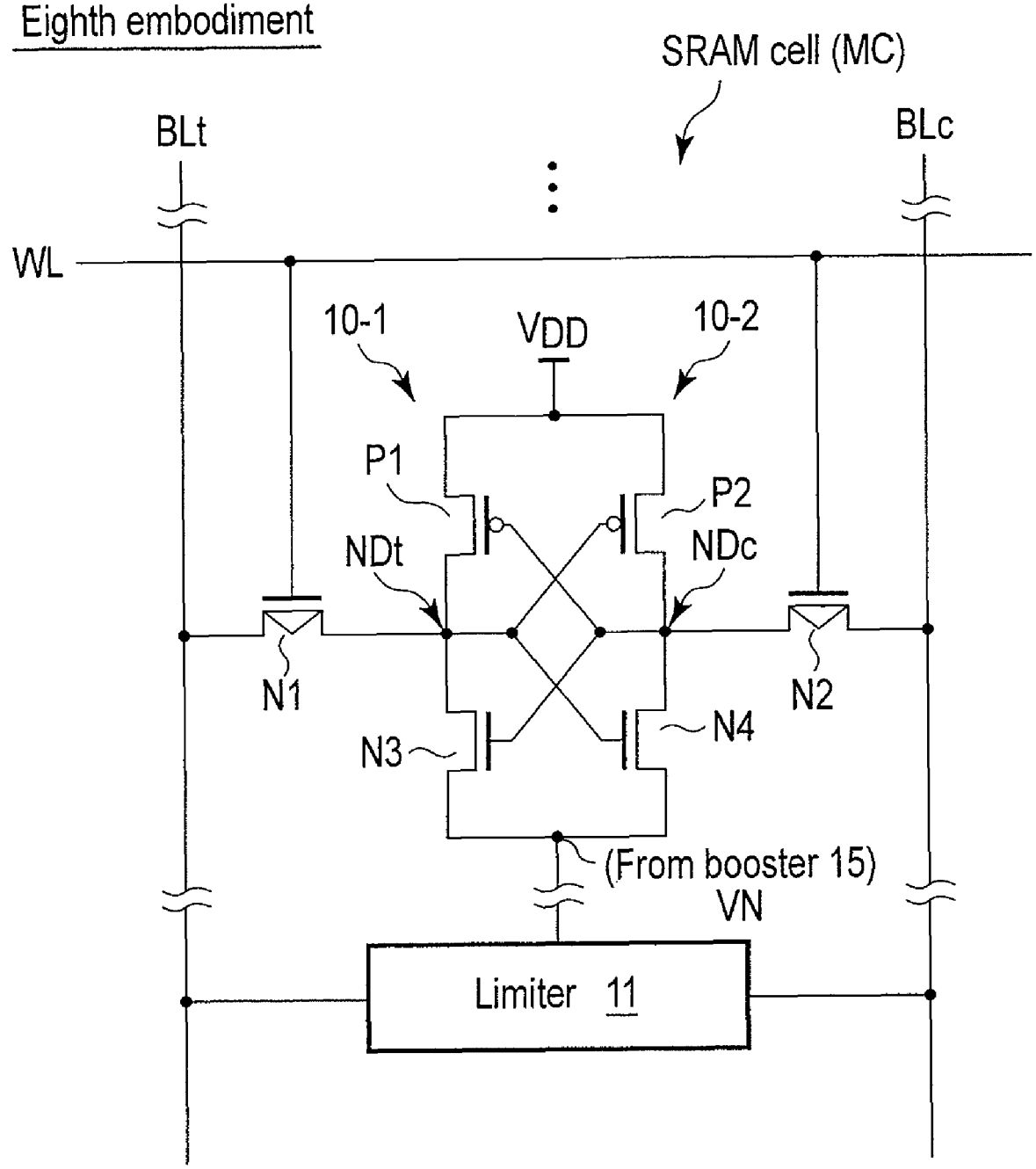
FIG. 18 is an equivalent circuit diagram showing a memory cell (SRAM cell) according to the eighth embodiment.

The limiter 11 is arranged for each column, and is therefore connected to a virtual ground node VN of the memory cell MC, as shown in FIG. 18. The limiter 11 has its control terminals connected to the bit lines BLt and BLc.

Moreover, in the eighth embodiment, the power supply booster 15 according to the seventh embodiment is adopted. That is, the power supply booster 15 switches the power supply voltage connected to the ground power supply voltage applied to the virtual ground node VN of the memory cell MC (from $V_{SS}$ to $V_{SSL}$). Therefore, a fixed internal power supply voltage $V_{DD}$ is applied to a node 1N in the memory cell MC.

<Example of Arrangement of Limiter>

An example of the arrangement of the limiter 11 according to the eighth embodiment will be described next with reference to FIG. 19. The limiter 11 can adopt an arrangement shown in FIG. 19, in addition to the arrangements according to the first to fifth embodiments.

Figure 19:
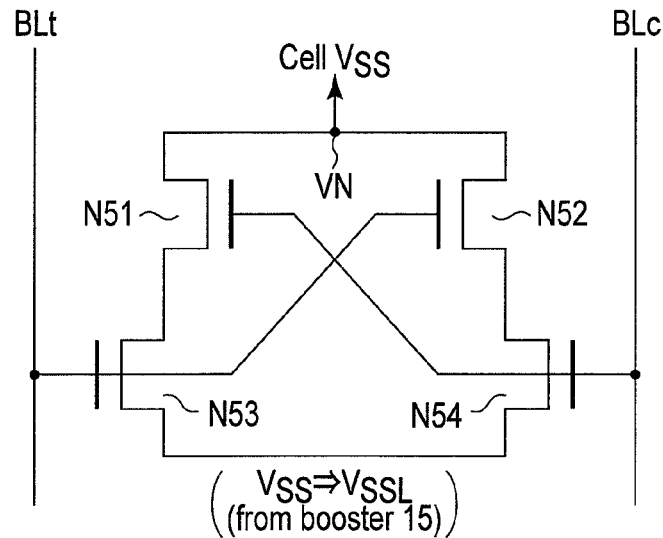
FIG. 19 is an equivalent circuit diagram showing a limiter according to the eighth embodiment.

That is, the limiter 11 according to the eighth embodiment is formed from nMOS transistors N51, N52, N53, and N54, as shown in FIG. 19.

Each of the nMOS transistors N51 and N52 has a current path with its one end connected to a ground power supply voltage $V_{SS}$ or $V_{SSL}$, that can be switched by the power supply booster 15, via the virtual ground node VN, and its other end connected to one end of the current path of the corresponding one of the nMOS transistors N53 and N54, and has its gate connected to the corresponding one of the bit lines BLt and BLc.

The other end of the current path of the nMOS transistor N53 and that of the current path of the nMOS transistor N54 are connected to each other, and the nMOS transistors N53 and N54 have their gates connected to the bit lines BLt and BLc, respectively.

<Operation (Data Read Operation)>

The operation of the limiter 11 according to the eighth embodiment will be described next with reference to FIGS. 20 and 21. The data read operation of the memory cell MC will be taken as an example herein.

Column on which Bit Lines have Insufficient Amplitude (Slow Column)

Figure 20:
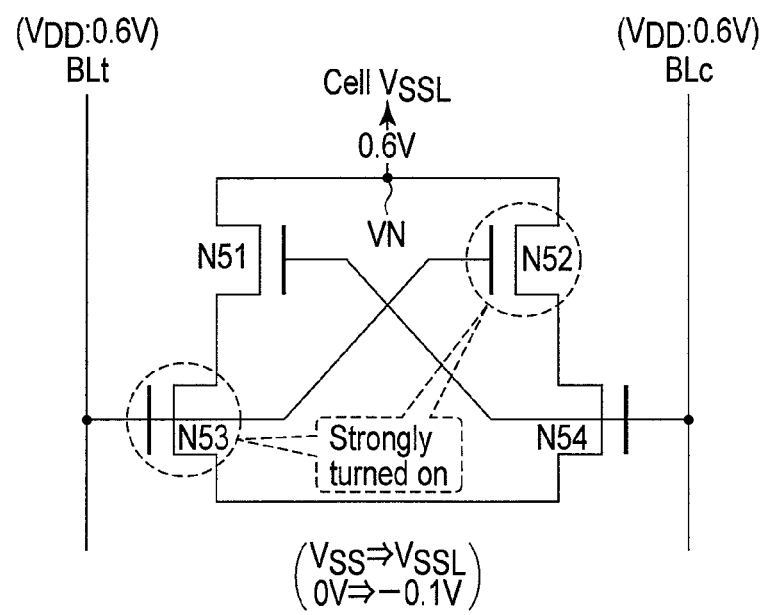
FIG. 20 is a circuit diagram showing the voltage relationship of the limiter on a column having an insufficient amplitude.

The voltage relationship of a column on which the bit lines have an insufficient amplitude (slow column) is as shown in FIG. 20.

In a slow memory cell MC in which the bit lines BLc and BLt have an insufficient amplitude, the bit lines BLc and BLt are applied with nearly the same voltage $V_{DD}$ (=about 0.6 V) and therefore have an insufficient potential difference between them, as shown in FIG. 20.

Therefore, while the virtual ground node VN is applied with nearly the same voltage $V_{DD}$ (=about 0.6 V), the power supply booster 15 according to the eighth embodiment switches the power supply voltage to the lower, negative power supply voltage $V_{SSL}$, (about −0.1 V), and applies it to the virtual ground node VN.

As a result, the nMOS transistors N52 and N53 which form the limiter 11 are strongly turned on, thereby contributing to an operation speedup.

Column on which Bit Lines have Sufficient Amplitude (Fast Column)

Figure 21:
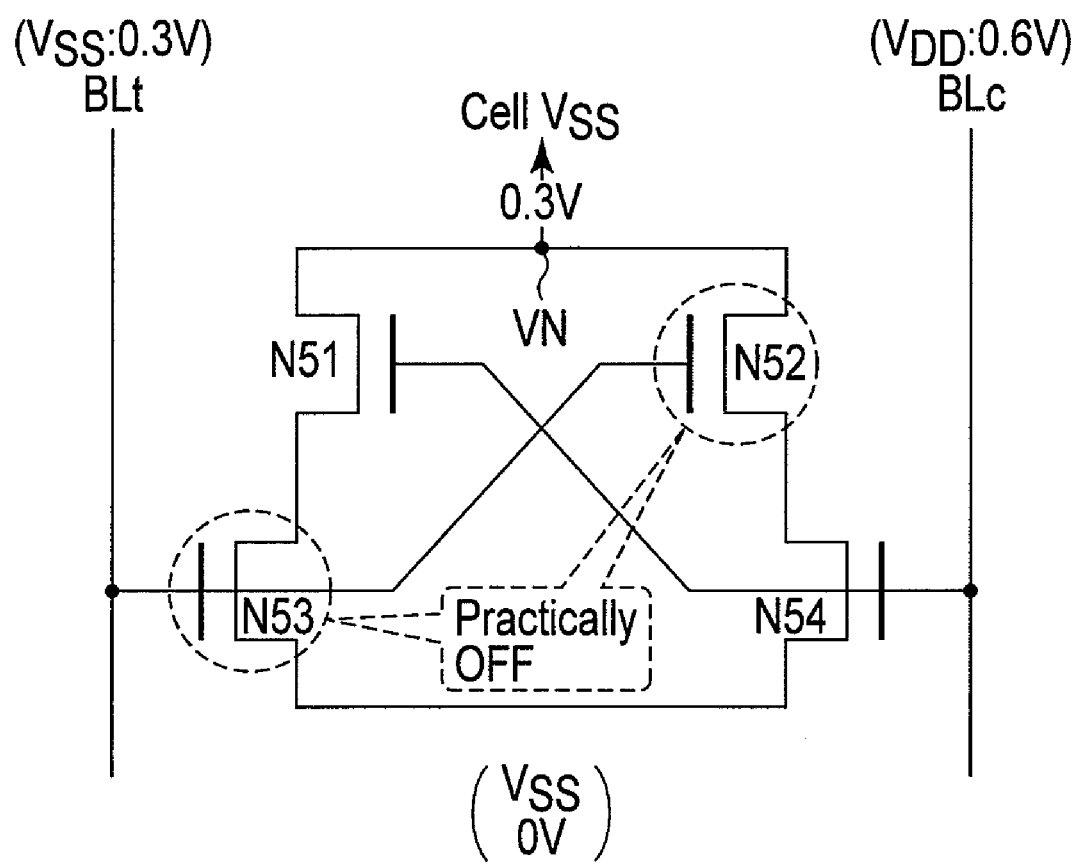
FIG. 21 is a circuit diagram showing the voltage relationship of the limiter on a column having a sufficient amplitude.

On the other hand, the voltage relationship of a column on which the bit lines have a sufficient amplitude (fast column) is as shown in FIG. 21.

In a fast memory cell MC in which the bit lines BLc and BLt have a sufficient amplitude, the bit lines BLc and BLt are applied with the voltage $V_{DD}$ (=about 0.6 V) and $V_{SS}$ (=about 0.3 V), respectively, and therefore have a sufficient potential difference between them, as shown in FIG. 21.

Therefore, the virtual ground node VN is applied with the ground power supply voltage $V_{SS}$ (=about 0.3 V), so the power supply booster 15 according to the eighth embodiment continues to apply the power supply voltage $V_{SS}$ (=about 0.3 V) to the virtual ground node VN.

This makes it possible to practically turn off the nMOS transistors N52 and N53 which form the limiter 11, thus cutting off the cell currents. In this manner, it is possible to limit the amplitude of the bit lines so that it does not become larger than necessary, and, in turn, to limit the flow of the cell current so that it does not become higher than necessary, thus achieving low power consumption.

<Effect>

Using the semiconductor memory device according to the eighth embodiment, at least effects (1) and (2) as mentioned above can be obtained.

Moreover, in the eighth embodiment, the semiconductor memory device further includes the limiters 11 each of which monitors and limits the amplitude of the bit lines BLt and BLc so that it does not become larger than necessary when a sufficient amplitude is generated on the bit lines BLt and BLc upon, for example, a data read operation.

Therefore, as described above, the eighth embodiment is advantageous in reducing the power consumption in terms of cutting excessive power consumption due to charge or discharge of the bit lines BLt and BLt upon, for example, a data read operation.

[Ninth Embodiment (Example in which Present Embodiment is Applied to Pch-Xfer Cell)]

A semiconductor memory device according to the ninth embodiment will be described next with reference to FIGS. 22 and 23. This embodiment relates to an example in which the present embodiment is applied to a memory cell (Pch-Xfer Cell) formed by replacing the conductivity type of transfer transistors N1 and N2 of a memory cell MC with the opposite conductivity type (p type). The same parts as in the sixth embodiment will not be described in detail hereinafter.

<Example of Arrangement of Memory Cell MC>

The memory cell MC according to the ninth embodiment is a memory cell (Pch-Xfer Cell) including transfer transistors of p conductivity type, as shown in FIG. 22.

The memory cell MC according to the ninth embodiment shown in FIG. 22 similarly stores data between a ground power supply voltage $V_{SS}$ applied to a node PWN (first node) and a voltage $V_{DD}$ or $V_{DDH}$ applied to a node VN (second node). The node VN is similarly applied with the power supply voltage $V_{DD}$ or $V_{DDH}$ (>$V_{DD}$) generated by a power supply booster 15.

The memory cell MC includes transfer transistors P10 and P20, and inverter circuits 10-1 and 10-2 connected in a flip-flop configuration so as to store data, as shown in FIG. 22.

The transfer transistor P10 has a current path with its one end connected to a bit line BLt, and its other end connected to a node (latch node) NDt of the inverter circuit 10-1, and has its gate connected to a word line WL. The transfer transistor P20 has a current path with its one end connected to a bit line BLc, and its other end connected to a node (latch node) NDc of the inverter circuit 10-2, and has its gate connected to the word line WL.

The inverter circuit 10-1 includes a load transistor N10 and driver transistor P30. The driver transistor P30 has a current path with its one end connected to the node VN, and its other end connected to one end of the current path of the load transistor N10 at the node NDt, and has its gate connected to the gate of the load transistor N10 and the node NDc of the inverter circuit 10-2. The current path of the load transistor N10 has its other end applied with the ground power supply voltage $V_{SS}$ via the node PWN.

The inverter circuit 10-2 includes a load transistor N20 and driver transistor P40. The driver transistor P40 has its one end connected to the node VN, and its other end connected to one end of the current path of the load transistor N20 at the node NDc, and has its gate connected to the gate of the load transistor N20 and the node NDt of the inverter circuit 10-1. The current path of the load transistor N20 has its other end applied with the ground power supply voltage $V_{SS}$ via the node PWN.

A limiter 11 is similarly arranged in the memory cell MC. The limiter 11 monitors and limits the amplitude of the bit lines BLt and BLc so that it does not become larger than necessary when a sufficient amplitude is generated on the bit lines BLt and BLc upon, for example, a data read operation.

<Example of Arrangement of Limiter 11>

Figure 23:
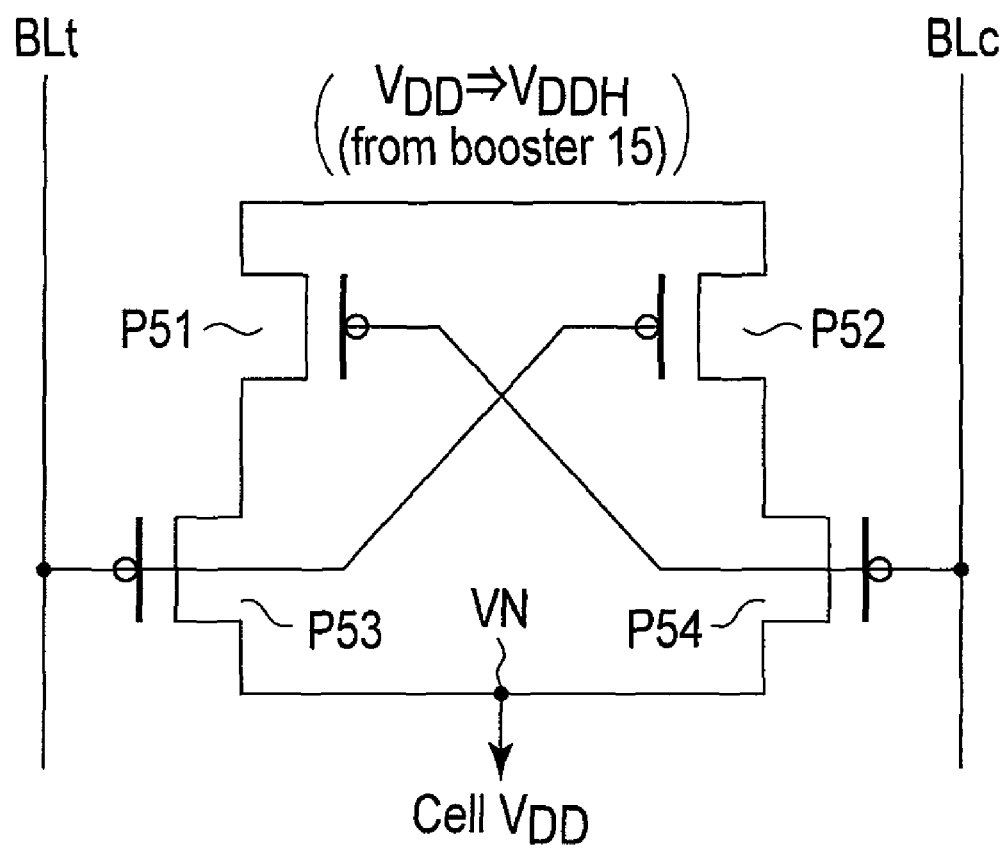
FIG. 23 is an equivalent circuit diagram showing a limiter according to the ninth embodiment.

The limiter 11 applied to the memory cell MC (Pch-Xfer Cell) according to the ninth embodiment is as shown in FIG. 23.

The limiter 11 according to the ninth embodiment is different from that according to the eighth embodiment in that the former includes pMOS transistors P51, P52, P53, and P54, as shown in FIG. 23.

Each of the pMOS transistors P51 and P52 has a current path with its one end connected to the power supply voltage $V_{DD}$ or $V_{DDH}$ switched by the power supply booster 15 via the node VN, and its other end connected to one end of the current path of the corresponding one of the pMOS transistors P53 and P54, and has its gate connected to the corresponding one of the bit lines BLc and BLt.

The other end of the current path of the pMOS transistor P51 and that of the current path of the pMOS transistor P52 are connected to each other, and the pMOS transistors P51 and P52 have their gates connected to the bit lines BLt and BLc, respectively.

Other arrangements, operations, etc. are practically the same as in the sixth embodiment, and a detailed description thereof will not be given.

<Effect>

Using the semiconductor memory device according to the ninth embodiment, at least effects (1) and (2) as mentioned above can be obtained.

Moreover, the memory cell MC according to the ninth embodiment is a memory cell (Pch-Xfer Cell) including transfer transistors of p conductivity type. Therefore, the limiter 11 applied to the memory cell MC includes the pMOS transistors P51, P52, P53, and P54.

With the above-mentioned arrangement, the p-type transfer transistors P10 and P20 capable of improving the element characteristics with little variation resulting from factors associated with a manufacturing process are applicable to the memory cell MC. This makes it possible to prevent bit line delay. Therefore, the ninth embodiment is advantageous in attaining a further operation speedup.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of memory cells each of which is arranged at an intersection position between a pair of complementary bit lines and a word line, and configured to store data between a first power supply voltage applied to a first node and a voltage applied to a virtual ground node; and
    a limiter which has an input and an output interposed between the virtual ground node and a second power supply node, and control terminals connected to the pair of bit lines, and is configured to monitor an amplitude of the pair of bit lines to limit a current path to the second power supply voltage when a sufficient amplitude is generated on the pair of bit lines.

2. The device of claim 1, further comprising a power supply booster configured to monitor the amplitude of the pair of bit lines, and perform switching so as to boost the first power supply voltage applied to the first node of the memory cell having an insufficient bit line amplitude in data read.

3. The device of claim 1, wherein the limiter includes a first transistor having a gate connected to one of the pair of bit lines, and a second transistor having a gate connected to the other of the pair of bit lines, the first transistor and the second transistor having current paths connected in series between the virtual ground node and the second power supply voltage.

4. The device of claim 1, wherein the limiter includes a third transistor having a gate connected to one of the pair of bit lines, and a fourth transistor having a gate connected to the other of the pair of bit lines, the third transistor and the fourth transistor having current paths connected in parallel between the virtual ground node and the second power supply voltage.

5. The device of claim 1, wherein the limiter includes:
    a fifth transistor having a gate connected to one of the pair of bit lines, and a sixth transistor having a gate connected to the other of the pair of bit lines, the fifth transistor and the sixth transistor having current paths connected in series between the virtual ground node and the second power supply voltage; and
    a seventh transistor having a gate connected to said other of the pair of bit lines, and an eighth transistor having a gate connected to said one of the pair of bit lines, the seventh transistor and the eighth transistor having current paths connected in series between the virtual ground node and the second power supply voltage.

6. The device of claim 2, wherein the power supply booster includes:
    a NAND circuit configured to input potential signals of the pair of bit lines, and output a boost signal corresponding to an input pre-sense signal;
    an inverter circuit configured to invert and output the input boost signal;
    a first switching element which has a back gate applied with the first power supply voltage, a current path with one end applied with the first power supply voltage, and the other end electrically connected to the first node, and a gate connected to the inverter circuit; and
    a second switching element which has a back gate applied with a power supply voltage higher or lower than the first power supply voltage, a current path with one end applied with the power supply voltage higher or lower than the first power supply voltage, and the other end electrically connected to the first node, and a gate connected to the inverter circuit.

7. The device of claim 1, wherein in a memory macro formed by arranging the plurality of memory cells in a matrix, the limiter and the power supply booster are arranged at each of two ends of each column, arranged for said each column, or arranged for each set of the plurality of memory cells.

8. A semiconductor memory device comprising:
a plurality of memory cells each of which is arranged at an intersection position between a pair of complementary bit lines and a word line, and configured to store data between a first power supply voltage applied to a first node and a voltage applied to a virtual ground node; and
a control circuit configured to change an amount of current of the pair of bit lines in accordance with an amplitude of the pair of bit lines for each column in a memory macro, that is formed by arranging the plurality of memory cells in a matrix, in a data read operation of each of the plurality of memory cells.

9. The device of claim 8, wherein the control circuit comprises a limiter which has an input and an output interposed between the virtual ground node and a second power supply node, and control terminals connected to the pair of bit lines, and is configured to monitor the amplitude of the pair of bit lines to limit a current path to the second power supply voltage when a sufficient amplitude is generated on the pair of bit lines.

10. The device of claim 8, wherein the control circuit comprises a power supply booster configured to monitor the amplitude of the pair of bit lines, and perform switching so as to boost the first power supply voltage applied to the first node of the memory cell having an insufficient bit line amplitude in data read.

11. The device of claim 9, wherein the limiter includes a first transistor having a gate connected to one of the pair of bit lines, and a second transistor having a gate connected to the other of the pair of bit lines, the first transistor and the second transistor having current paths connected in series between the virtual ground node and the second power supply voltage.

12. The device of claim 9, wherein the limiter includes a third transistor having a gate connected to one of the pair of bit lines, and a fourth transistor having a gate connected to the other of the pair of bit lines, the third transistor and the fourth transistor having current paths connected in parallel between the virtual ground node and the second power supply voltage.

13. The device of claim 9, wherein the limiter includes:
a fifth transistor having a gate connected to one of the pair of bit lines, and a sixth transistor having a gate connected to the other of the pair of bit lines, the fifth transistor and the sixth transistor having current paths connected in series between the virtual ground node and the second power supply voltage; and
a seventh transistor having a gate connected to said other of the pair of bit lines, and an eighth transistor having a gate connected to said one of the pair of bit lines, the seventh transistor and the eighth transistor having current paths connected in series between the virtual ground node and the second power supply voltage.

14. The device of claim 10, wherein the power supply booster includes:
a NAND circuit configured to input potential signals of the pair of bit lines, and output a boost signal corresponding to an input pre-sense signal;
an inverter circuit configured to invert and output the input boost signal;
a first switching element which has a back gate applied with the first power supply voltage, a current path with one end applied with the first power supply voltage, and the other end electrically connected to the first node, and a gate connected to the inverter circuit; and
a second switching element which has a back gate applied with a power supply voltage higher or lower than the first power supply voltage, a current path with one end applied with the power supply voltage higher or lower than the first power supply voltage, and the other end electrically connected to the first node, and a gate connected to the inverter circuit.

15. The device of claim 8, wherein in a memory macro formed by arranging the plurality of memory cells in a matrix, the control circuit is arranged at each of two ends of each column, arranged for said each column, or arranged for each set of the plurality of memory cells.

* * * * *